US012567850B2

(12) United States Patent (10) Patent No.: US 12,567,850 B2
Ishii et al. (45) Date of Patent: Mar. 3, 2026

(54) ACOUSTIC WAVE DEVICE AND MANUFACTURING METHOD FOR ACOUSTIC WAVE DEVICE

(71) Applicant: Murata Manufacturing Co., Ltd., Nagaokakyo (JP)

(72) Inventors: Yuta Ishii, Nagaokakyo (JP); Kazunori Inoue, Nagaokakyo (JP); Seiji Kai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 210 days.

(21) Appl. No.: 18/381,203

(22) Filed: Oct. 18, 2023

(65) Prior Publication Data

US 2024/0048114 A1 Feb. 8, 2024

Related U.S. Application Data

(63) Continuation of application No. PCT/JP2022/018226, filed on Apr. 19, 2022.
(Continued)

(51) Int. Cl.
*H03H 9/02* (2006.01)
*H03H 3/02* (2006.01)

(52) U.S. Cl.
CPC .......... *H03H 9/02133* (2013.01); *H03H 3/02* (2013.01); *H03H 9/02015* (2013.01); *H03H 9/02228* (2013.01)

(58) Field of Classification Search
CPC ............... H03H 9/02133; H03H 9/173; H03H 9/02228; H03H 9/02157; H03H 9/02015;
(Continued)

(56) References Cited

U.S. PATENT DOCUMENTS

| | | | |
|---|---|---|---|
| 7,319,284 B2* | 1/2008 | Chen | ........................ H03H 3/08 310/313 R |
| 11,742,816 B2* | 8/2023 | Irieda | ................. H03H 9/02102 310/311 |

(Continued)

FOREIGN PATENT DOCUMENTS

| | | |
|---|---|---|
| JP | 2012257019 A | 12/2012 |
| JP | 2013214954 A | 10/2013 |

(Continued)

OTHER PUBLICATIONS

International Search Report in PCT/JP2022/018226, mailed Jul. 19, 2022, 3 pages.
(Continued)

*Primary Examiner* — Quan Tra
(74) *Attorney, Agent, or Firm* — Keating & Bennett, LLP

(57) ABSTRACT

An acoustic wave device includes a support substrate with a thickness in a first direction, a piezoelectric layer above or below the support substrate, and a functional electrode on the piezoelectric layer. A space is between the support substrate and the piezoelectric layer to least partially overlap the functional electrode in a plan view in the first direction. At least one through-hole extends through the piezoelectric layer, communicates with the space, and is inside an outer edge of the space in a plan view in the first direction.

19 Claims, 33 Drawing Sheets

Related U.S. Application Data

(60) Provisional application No. 63/176,594, filed on Apr. 19, 2021, provisional application No. 63/176,520, filed on Apr. 19, 2021.

(58) Field of Classification Search
CPC .. H03H 9/1035; H03H 3/02; H03H 2003/021; H03H 9/0514; H03H 2003/023
See application file for complete search history.

(56) References Cited

U.S. PATENT DOCUMENTS

| | | | | |
|---|---|---|---|---|
| 2005/0264137 A1* | 12/2005 | Taniguchi | ............. | H03H 9/173 310/324 |
| 2013/0082573 A1* | 4/2013 | Kuroda | ............... | H10N 30/082 29/25.35 |
| 2013/0234805 A1 | 9/2013 | Takahashi | | |
| 2014/0152145 A1* | 6/2014 | Kando | .............. | H03H 9/02574 29/25.35 |
| 2017/0338798 A1* | 11/2017 | Sakashita | ................. | H03H 9/54 |
| 2018/0145655 A1* | 5/2018 | Tsutsumi | ................. | H03H 3/02 |
| 2020/0321939 A1 | 10/2020 | Turner et al. | | |
| 2022/0102617 A1* | 3/2022 | Aiba | ..................... | H10N 39/00 |
| 2022/0216842 A1 | 7/2022 | Nagatomo et al. | | |
| 2024/0088864 A1* | 3/2024 | Inoue | .................... | H03H 9/176 |
| 2024/0113683 A1* | 4/2024 | Omura | ................... | H03H 9/173 |
| 2024/0154598 A1* | 5/2024 | Wu | ..................... | H03H 9/2463 |
| 2024/0235521 A1* | 7/2024 | Yamane | .............. | H03H 9/0523 |

FOREIGN PATENT DOCUMENTS

| | | | | |
|---|---|---|---|---|
| JP | 2016086308 A | * | 5/2016 | |
| WO | 2016147687 A1 | | 9/2016 | |
| WO | 2021060523 A1 | | 4/2021 | |

OTHER PUBLICATIONS

Written Opinion in PCT/JP2022/018226, mailed Jul. 19, 2022, 5 pages.

* cited by examiner

FIG. 14

ACOUSTIC WAVE DEVICE AND MANUFACTURING METHOD FOR ACOUSTIC WAVE DEVICE

CROSS REFERENCE TO RELATED APPLICATIONS

This application claims the benefit of priority to Provisional Application No. 63/176,594 and 63/176,520 filed on Apr. 19, 2021 and is a Continuation Application of PCT Application No. PCT/JP2022/018226 filed on Apr. 19, 2022. The entire contents of each application are hereby incorporated herein by reference.

BACKGROUND OF THE INVENTION

1. Field of the Invention

The present disclosure relates to an acoustic wave device and a manufacturing method for an acoustic wave device.

2. Description of the Related Art

Japanese Unexamined Patent Application Publication No. 2012-257019 describes an acoustic wave device.

In Japanese Unexamined Patent Application Publication No. 2012-257019, a through-hole that communicates with a cavity portion can be provided, and a sacrificial layer at a portion that will be the cavity portion can be etched through the through-hole. There is a possibility that a crack starting from the through-hole occurs in a piezoelectric layer.

SUMMARY OF THE INVENTION

Preferred embodiments of the present invention reduce or prevent a crack starting from a through-hole of a piezoelectric layer.

An acoustic wave device according to a preferred embodiment of the present invention includes a support substrate with a thickness in a first direction, a piezoelectric layer above or below the support substrate, and a functional electrode on the piezoelectric layer. A space is provided between the support substrate and the piezoelectric layer and at least partially overlaps the functional electrode in a plan view in the first direction. At least one through-hole extends through the piezoelectric layer, and the through-hole communicates with the space. The through-hole is inside an outer edge of the space in a plan view in the first direction.

A manufacturing method for an acoustic wave device according to a preferred embodiment of the present invention includes preparing a support substrate and a piezoelectric layer including a first principal surface and a second principal surface on an opposite side to the first principal surface, laminating an intermediate layer in which a sacrificial layer is embedded, on the second principal surface of the piezoelectric layer, and bonding the piezoelectric layer and the support substrate with the intermediate layer interposed between the piezoelectric layer and the support substrate; after the preparing, forming at least a functional electrode and a first portion of a support portion; after the forming the at least a functional electrode and the first portion of a support portion, forming a through-hole in the piezoelectric layer at a position that overlaps the sacrificial layer in a lamination direction of the support substrate and the piezoelectric layer in a plan view, causing an etchant to enter the sacrificial layer via the through-hole, and forming a first cavity portion by removing the sacrificial layer;

preparing a lid substrate and forming a second portion of the support portion in the lid substrate; and a second cavity portion formation step of, after the forming the first cavity and the preparing the lid, forming a second cavity portion between the functional electrode and the lid substrate by joining the first portion of the support portion with the second portion of the support portion.

According to preferred embodiments of the present invention, a crack starting from a through-hole of a piezoelectric layer is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 is a cross-sectional view taken along the line XIV-XIV in FIG. 13.

DETAILED DESCRIPTION OF THE PREFERRED EMBODIMENTS

Hereinafter, preferred embodiments of the present disclosure will be described in detail with reference to the accompanying drawings. The present disclosure is not limited to the preferred embodiments. Each of the preferred embodiments described in the present disclosure is illustrative and partial replacements or combinations of components are possible among different preferred embodiments. In the modifications and second and subsequent preferred embodiments, the description of the same or similar matters to those of the first preferred embodiment is omitted, and only the differences will be described. Particularly, the same or similar operation and advantageous effects with the same or similar components will not be repeated one by one for each preferred embodiment.

Figure 1A:
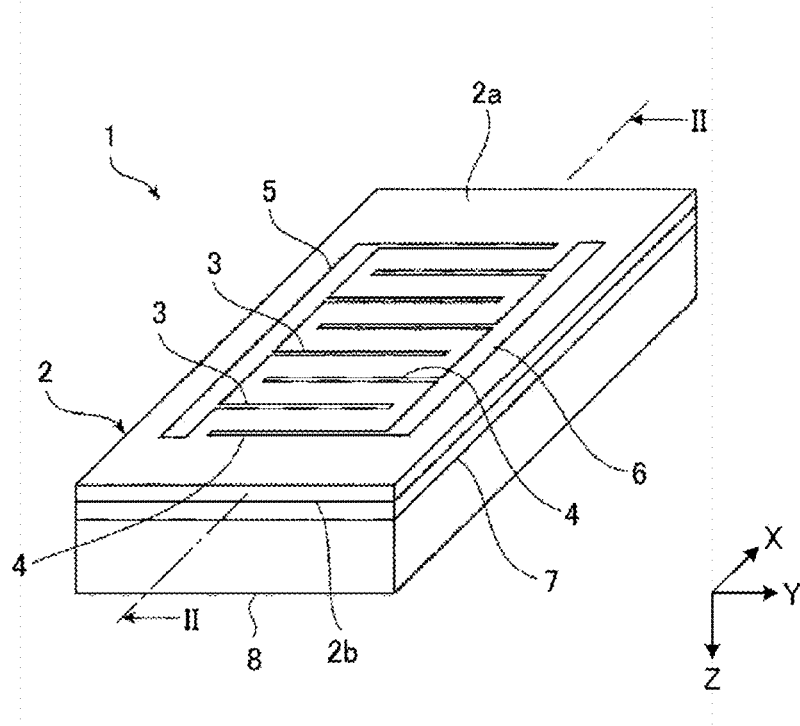
FIG. 1A is a perspective view of an acoustic wave device according to a preferred embodiment of the present invention.
Figure 1B:
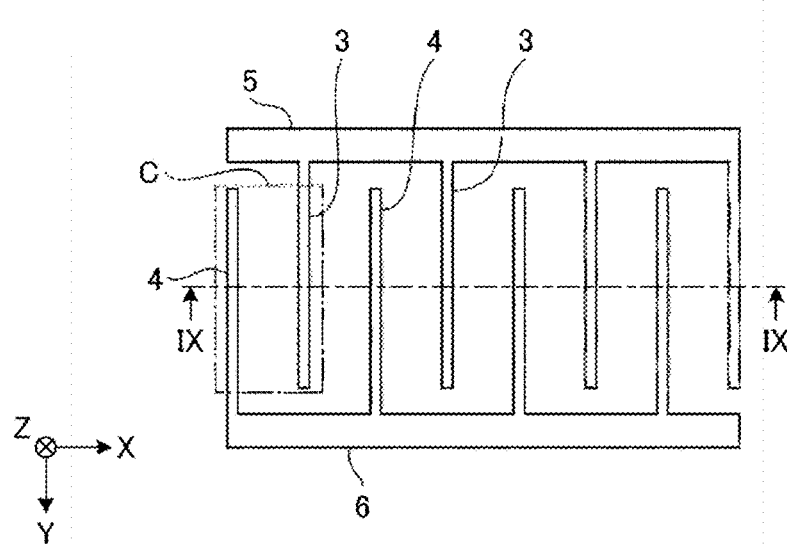
FIG. 1B is a plan view of an electrode structure according to a preferred embodiment of the present invention.

FIG. 1A is a perspective view of an acoustic wave device according to a preferred embodiment. FIG. 1B is a plan view of an electrode structure according to the present preferred embodiment.

An acoustic wave device 1 according to the present preferred embodiment includes a piezoelectric layer 2 made of, for example, $LiNbO_3$. The piezoelectric layer 2 may be made of, for example, $LiTaO_3$. The cut angle of $LiNbO_3$ or $LiTaO_3$ is Z-cut in the present preferred embodiment. The cut angle of $LiNbO_3$ or $LiTaO_3$ may be rotated Y-cut or X-cut. Preferably, for example, a propagation direction of about ±30° with respect to Y propagation or X propagation is provided.

The thickness of the piezoelectric layer 2 is not limited and is preferably, for example, greater than or equal to about 50 nm and less than or equal to about 1000 nm to effectively excite a first thickness-shear mode.

The piezoelectric layer 2 includes a first principal surface 2a and a second principal surfaces 2b opposed to each other in a Z direction. Electrode fingers 3 and electrode fingers 4 are provided on the first principal surface 2a.

Here, the electrode fingers 3 are examples of the "first electrode finger", and the electrode fingers 4 are examples of the "second electrode finger". In FIGS. 1A and 1B, the plurality of electrode fingers 3 is a plurality of first electrode fingers connected to a first busbar electrode 5. The plurality of electrode fingers 4 is a plurality of second electrode fingers connected to a second busbar electrode 6. The plurality of electrode fingers 3 and the plurality of electrode fingers 4 are interdigitated with each other. Thus, a functional electrode 30 including the electrode fingers 3, the electrode fingers 4, the first busbar electrode 5, and the second busbar electrode 6 is formed. The functional electrode 30 is also referred to as interdigital transducer (IDT) electrode.

The electrode fingers 3 and the electrode fingers 4 each have a rectangular or substantially rectangular shape and have a length direction. In a direction orthogonal or substantially orthogonal to the length direction, each of the electrode fingers 3 and an adjacent one of the electrode fingers 4 are opposed to each other. The length direction of the electrode fingers 3 and electrode fingers 4 and the direction orthogonal or substantially orthogonal to the length direction of the electrode fingers 3 and electrode fingers 4 both are directions that intersect with a thickness direction of the piezoelectric layer 2. For this reason, each of the electrode fingers 3 and one of the electrode fingers 4, adjacent to the electrode finger 3, may be regarded as being opposed to each other in the direction that intersects with the thickness direction of the piezoelectric layer 2. In the following description, the description can be made on the assumption that the thickness direction of the piezoelectric layer 2 is a Z direction (or first direction), the length direction of the electrode fingers 3 and electrode fingers 4 is a Y direction (or second direction), and the direction orthogonal or substantially orthogonal to the electrode fingers 3 and the electrode fingers 4 is an X direction (or third direction).

Alternatively, the length direction of the electrode fingers 3 and electrode fingers 4 may be interchanged with the direction orthogonal or substantially orthogonal to the length direction of the electrode fingers 3 and electrode fingers 4, shown in FIGS. 1A and 1B. In other words, in FIGS. 1A and 1B, the electrode fingers 3 and the electrode fingers 4 may be extended in a direction in which the first busbar electrode 5 and the second busbar electrode 6 extend. In this case, the first busbar electrode 5 and the second busbar electrode 6 extend in the direction in which the electrode fingers 3 and the electrode fingers 4 extend in FIGS. 1A and 1B. A plurality of pairs of adjacent electrode fingers 3, 4 respectively connected to one potential and the other potential is provided in the direction orthogonal to the length direction of the electrode fingers 3 and electrode fingers 4.

Here, a state where the electrode finger 3 and the electrode finger 4 are adjacent to each other does not mean a case where the electrode finger 3 and the electrode finger 4 are disposed so as to be in direct contact with each other, and means a case where the electrode finger 3 and the electrode finger 4 are disposed with a gap therebetween. When the electrode finger 3 and the electrode finger 4 are adjacent to each other, no electrode connected to a hot electrode or a ground electrode, including the other electrode fingers 3 and electrode fingers 4, is disposed between the electrode finger 3 and the electrode finger 4. The number of the pairs is not necessarily an integer number of pairs and may be 1.5 pairs, 2.5 pairs, or the like.

A center-to-center distance between the electrode finger 3 and the electrode finger 4, that is, pitch, preferably falls within the range of, for example, greater than or equal to about 1 μm and less than or equal to about 10 μm. A center-to-center distance between the electrode finger 3 and the electrode finger 4 is a distance between the center of the width dimension of the electrode finger 3 in the direction orthogonal or substantially orthogonal to the length direction of the electrode finger 3 and the center of the width dimension of the electrode finger 4 in the direction orthogonal or substantially orthogonal to the length direction of the electrode finger 4.

In addition, when at least one of the number of electrode fingers 3 and the number of electrode fingers 4 is more than one (when, where the electrode finger 3 and the electrode finger 4 are assumed as a paired electrode set, 1.5 pairs or more of the electrode sets), the center-to-center distance between the electrode finger 3 and the electrode finger 4 means an average of the center-to-center distance between any adjacent electrode finger 3 and electrode finger 4 of the 1.5 pairs or more of the electrode finger 3 and electrode finger 4.

The width of each of the electrode finger 3 and the electrode finger 4, that is, the dimension of each of the electrode finger 3 and the electrode finger 4 in the opposed direction, preferably falls within the range of, for example, greater than or equal to about 150 nm and less than or equal to about 1000 nm. A center-to-center distance between the electrode finger 3 and the electrode finger 4 is a distance between the center of the dimension (width dimension) of the electrode finger 3 in the direction orthogonal to the length direction of the electrode finger 3 and the center of the dimension (width dimension) of the electrode finger 4 in the direction orthogonal or substantially orthogonal to the length direction of the electrode finger 4.

In the present preferred embodiment, since the Z-cut piezoelectric layer is used, the direction orthogonal or substantially orthogonal to the length direction of the electrode fingers 3 and electrode fingers 4 is a direction orthogonal or substantially orthogonal to a polarization direction of the piezoelectric layer 2. When a piezoelectric body with another cut angle is used as the piezoelectric layer 2, this does not apply. Here, the term "orthogonal" is not limited only to a strictly orthogonal case and may be substantially orthogonal (an angle formed between the direction orthogonal to the length direction of the electrode fingers 3 and electrode fingers 4 and the polarization direction is, for example, about 90°±10°).

Figure 2:
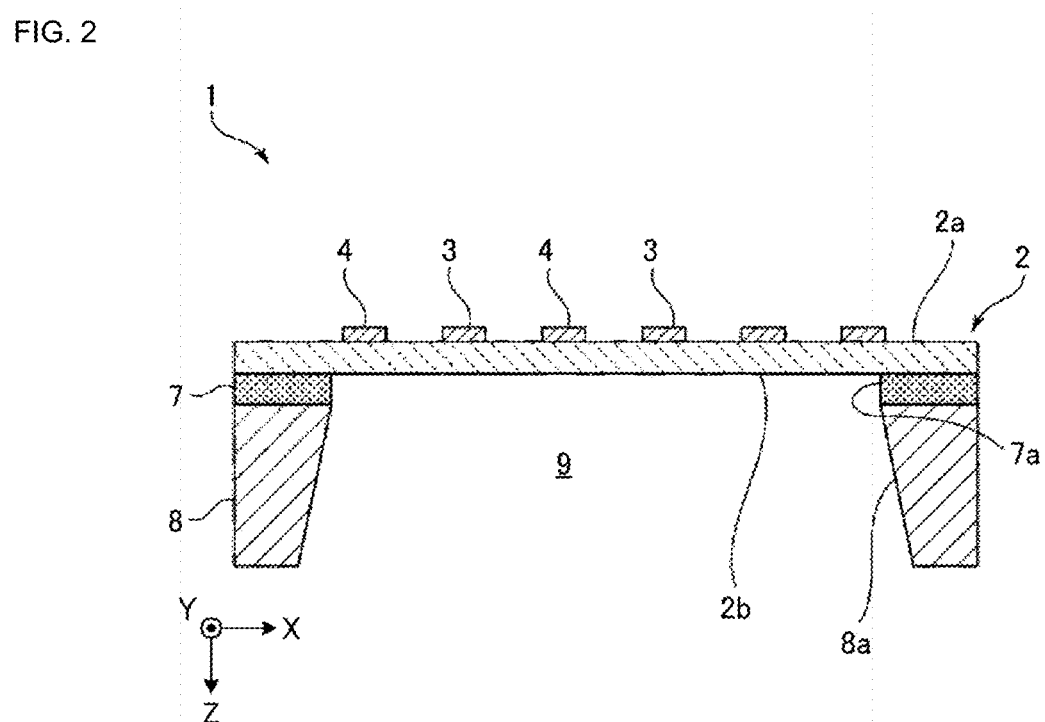
FIG. 2 is a cross-sectional view taken along the line II-II in FIG. 1A.

A support substrate 8 is laminated to the second principal surface 2b of the piezoelectric layer 2 with an intermediate layer 7 interposed therebetween. As shown in FIG. 2, the intermediate layer 7 has a frame shape and includes a cavity 7a, and the support substrate 8 has a frame shape and includes a cavity 8a. With this configuration, a cavity portion (air gap) 9 is provided.

The cavity portion 9 is provided so as not to impede vibrations of an excitation region C of the piezoelectric layer 2. Therefore, the support substrate 8 is laminated to the second principal surface 2b with the intermediate layer 7 interposed therebetween, at a position that does not overlap a portion where the at least one pair of electrode finger 3 and electrode finger 4 is provided. The intermediate layer 7 does not need to be provided. Therefore, the support substrate 8 can be laminated directly or indirectly on the second principal surface 2b of the piezoelectric layer 2.

The intermediate layer 7 is made of, for example, silicon oxide. The intermediate layer 7 may be made of an appropriate electrically insulating material, such as, for example, silicon nitride and alumina, other than silicon oxide. Here, the intermediate layer 7 is an example of an intermediate layer.

The support substrate 8 is made of, for example, Si. A plane direction of a piezoelectric layer 2-side surface of Si may be (100) or (110) or may be (111). Preferably, high-resistance Si having a resistivity of, for example, higher than or equal to about 4 kΩ) is provided. The support substrate 8 may also be made of an appropriate electrically insulating material or an appropriate semiconductor material. Examples of the material of the support substrate 8 include a piezoelectric body, such as aluminum oxide, lithium tantalate, lithium niobate, and quartz crystal, various ceramics, such as alumina, magnesia, sapphire, silicon nitride, aluminum nitride, silicon carbide, zirconia, cordierite, mullite, steatite, and forsterite, a dielectric, such as diamond and glass, and a semiconductor, such as gallium nitride.

The plurality of electrode fingers 3, the plurality of electrode fingers 4, the first busbar electrode 5, and the second busbar electrode 6 are made of an appropriate metal or alloy, such as, for example, Al and AlCu alloy. In the present preferred embodiment, the electrode fingers 3, the electrode fingers 4, the first busbar electrode 5, and the second busbar electrode 6 have a structure such that, for example, an Al film is laminated on a Ti film. A film other than a Ti film may be used as an adhesion layer.

At the time of driving, an alternating-current voltage is applied between the plurality of electrode fingers 3 and the plurality of electrode fingers 4. More specifically, an alternating-current voltage is applied between the first busbar electrode 5 and the second busbar electrode 6. With this configuration, resonant characteristics that use bulk waves in the first thickness-shear mode, which are excited in the piezoelectric layer 2, can be obtained.

In the acoustic wave device 1, when the thickness of the piezoelectric layer 2 is d and the center-to-center distance between any adjacent electrode finger 3 and electrode finger 4 of the plurality of pairs of electrode fingers 3 and electrode fingers 4 is p, d/p is, for example, less than or equal to about 0.5. For this reason, bulk waves in the first thickness-shear mode are effectively excited, so improved resonant characteristics are obtained. More preferably, d/p is, for example, less than or equal to about 0.24, and, in this case, further improved resonant characteristics are obtained.

When at least one of the electrode finger 3 and the electrode finger 4 is multiple as in the case of the present preferred embodiment, that is, when, where the electrode finger 3 and the electrode finger 4 are assumed as a paired electrode set, 1.5 pairs or more of the electrode finger 3 and the electrode finger 4 are provided, the center-to-center distance p between the adjacent electrode finger 3 and electrode finger 4 is an average distance of the center-to-center distances between any adjacent electrode finger 3 and electrode finger 4.

Since the acoustic wave device 1 of the present preferred embodiment has the above configuration, the quality factor is unlikely to decrease even when the number of pairs of the electrode finger 3 and the electrode finger 4 is reduced for the purpose of reducing the size. This is because the acoustic wave device 1 is a resonator that needs no reflectors on both sides and, therefore, a propagation loss is small. The reason why the reflector is not needed is because bulk waves in the first thickness-shear mode are used.

Figure 3A:
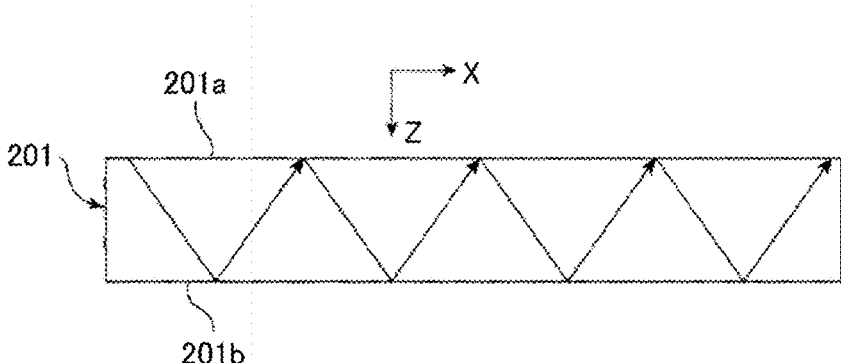
FIG. 3A is a schematic cross-sectional view for illustrating Lamb waves that propagate in a piezoelectric layer according to a comparative example.
Figure 3B:
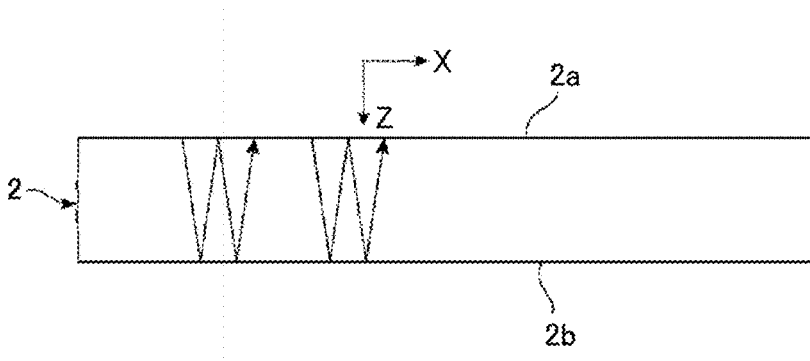
FIG. 3B is a schematic cross-sectional view for illustrating bulk waves in a first thickness-shear mode, which propagate in a piezoelectric layer according to a preferred embodiment of the present invention.
Figure 4:
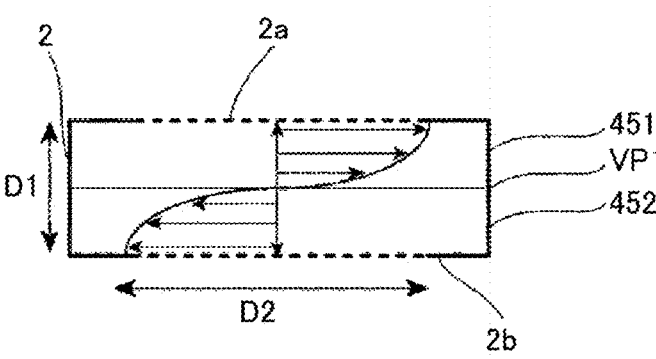
FIG. 4 is a schematic cross-sectional view for illustrating bulk waves in a first thickness-shear mode in an amplitude direction, which propagate in a piezoelectric layer according to a preferred embodiment of the present invention.

FIG. 3A is a schematic cross-sectional view for illustrating Lamb waves that propagate in a piezoelectric layer according to a comparative example. FIG. 3B is a schematic cross-sectional view for illustrating bulk waves in a first thickness-shear mode, which propagate in the piezoelectric layer according to the present preferred embodiment. FIG. 4 is a schematic cross-sectional view for illustrating bulk waves in a first thickness-shear mode in an amplitude direction, which propagate in the piezoelectric layer according to the present preferred embodiment.

FIG. 3A shows an acoustic wave device as described in Japanese Unexamined Patent Application Publication No. 2012-257019, and Lamb waves propagate in the piezoelectric layer. As shown in FIG. 3A, the waves propagate in a piezoelectric layer 201 as indicated by the arrows. Here, the piezoelectric layer 201 includes a first principal surface 201a and a second principal surface 201b, and a thickness direction connecting the first principal surface 201a and the second principal surface 201b is a Z direction. An X direction is a direction in which the electrode fingers 3, 4 of the functional electrode 30 are arranged. As shown in FIG. 3A, for Lamb waves, the waves propagate in the X direction. The waves are plate waves, so the piezoelectric layer 201 vibrates as a whole. However, the waves propagate in the X direction. Therefore, resonant characteristics are obtained by arranging a reflector on each side. For this reason, a wave propagation loss occurs, and the quality factor decreases when the size is reduced, that is, when the number of pairs of electrode fingers 3, 4 is reduced.

In contrast, as shown in FIG. 3B, in the acoustic wave device according to the present preferred embodiment, a vibration displacement is caused in the thickness-shear direction, so the waves propagate substantially in the direction connecting the first principal surface 2a and the second principal surface 2b of the piezoelectric layer 2, that is, the Z direction, and resonate. In other words, the X-direction components of the waves are significantly smaller than the Z-direction components. Since the resonant characteristics are obtained from the propagation of the waves in the Z direction, no reflectors are needed. Thus, there is no propagation loss when the waves propagate to the reflectors. Therefore, even when the number of pairs of electrodes consisting of the electrode fingers 3 and the electrode fingers 4 is reduced to reduce the size, the quality factor is unlikely to decrease.

As shown in FIG. 4, the amplitude direction of the bulk waves in the first thickness-shear mode is opposite between a first region 451 included in the excitation region C (see FIG. 1B) of the piezoelectric layer 2 and a second region 452 included in the excitation region C. FIG. 4 schematically shows bulk waves when a voltage with which the electrode fingers 4 are higher in potential than the electrode fingers 3 is applied between the electrode fingers 3 and the electrode fingers 4. The first region 451 is a region in the excitation region C between the first principal surface 2a and an imaginary plane VP1 that is orthogonal or substantially orthogonal to the thickness direction of the piezoelectric layer 2 and that divides the piezoelectric layer 2 into two. The second region 452 is a region in the excitation region C between the imaginary plane VP1 and the second principal surface 2b.

In the acoustic wave device 1, at least one pair of electrodes including the electrode finger 3 and the electrode finger 4 is provided. However, the waves are not caused to propagate in the X direction, so the number of pairs of electrodes including the electrode finger 3 and the electrode finger 4 does not necessarily need to be multiple. In other words, at least one pair of electrodes just needs to be provided.

For example, the electrode finger 3 is an electrode connected to a hot potential, and the electrode finger 4 is an electrode connected to a ground potential. The electrode finger 3 may be connected to a ground potential, and the electrode finger 4 may be connected to a hot potential. In the present preferred embodiment, each of the at least one pair of electrodes is an electrode connected to a hot potential or an electrode connected to a ground potential as described above, and no floating electrode is provided.

Figure 5:
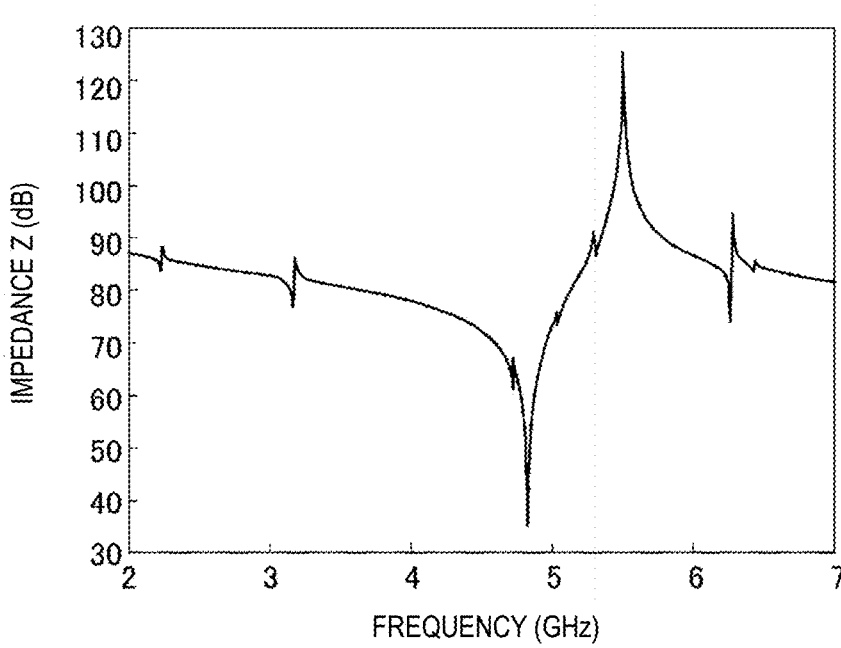
FIG. 5 is a graph that illustrates an example of the resonant characteristics of an acoustic wave device according to a present preferred embodiment of the present invention.

FIG. 5 is a graph that illustrates an example of the resonant characteristics of the acoustic wave device according to the present preferred embodiment. An example of the design parameters of the acoustic wave device 1 having the resonant characteristics shown in FIG. 5 are as follows.

The piezoelectric layer 2 is made of LiNbO$_3$ with Euler angles of (0°, 0°, 90°).

The thickness of the piezoelectric layer 2 is about 400 nm.

The length of the excitation region C (see FIG. 1B) is about 40 μm.

The number of pairs of electrodes consisting of the electrode fingers 3 and the electrode fingers 4 is 21.

The center-to-center distance (pitch) between the electrode finger 3 and the electrode finger 4 is about 3 μm.

The width of each of the electrode fingers 3 and the electrode fingers 4 is about 500 nm.

d/p is about 0.133.

The intermediate layer 7 is made of a silicon oxide film having a thickness of about 1 μm.

The support substrate 8 is Si.

The excitation region C (see FIG. 1B) is a region in which the electrode finger 3 and the electrode finger 4 overlap when viewed in the X direction orthogonal or substantially orthogonal to the length direction of the electrode fingers 3 and electrode fingers 4. The length of the excitation region C is the dimension of the excitation region C along the length direction of the electrode fingers 3 and electrode fingers 4. Here, the excitation region C is an example of an overlap region.

In the present preferred embodiment, the distance between any adjacent electrodes of the pairs of electrodes consisting of the electrode fingers 3 and the electrode fingers 4 is equal among all the plurality of pairs. In other words, the electrode fingers 3 and the electrode fingers 4 are disposed at a constant pitch.

As is apparent from FIG. 5, although no reflectors are provided, good resonant characteristics with a fractional band width of, for example, about 12.5% are obtained.

Incidentally, when the thickness of the piezoelectric layer 2 is d and the center-to-center distance between the electrodes of the electrode fingers 3 and the electrode fingers 4 is p, d/p is about, less than or equal to about 0.5 and preferably less than or equal to about 0.24 in the present preferred embodiment. This will be described with reference to FIG. 6.

Figure 6:
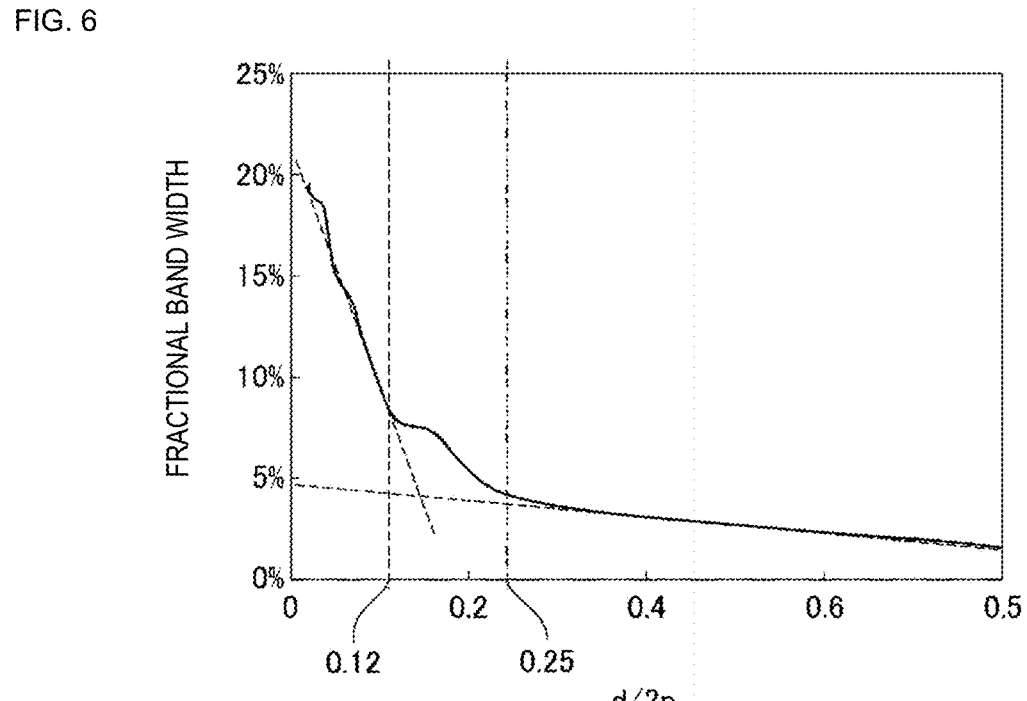
FIG. 6 is a graph that illustrates the relationship between $d/2p$ and a fractional band width as a resonator where a center-to-center distance between adjacent electrodes or an average distance of center-to-center distances between adjacent electrodes is p and an average thickness of the piezoelectric layer is d in an acoustic wave device according to a preferred embodiment of the present invention.

A plurality of acoustic wave devices are obtained while d/2p is changed as in the case of the acoustic wave device having the resonant characteristics shown in FIG. 5. FIG. 6 is a graph that illustrates the relationship between d/2p and a fractional band width as a resonator where a center-to-center distance between adjacent electrodes or an average distance of center-to-center distances between the adjacent electrodes is p and an average thickness of the piezoelectric layer 2 is d in the acoustic wave device according to the present preferred embodiment.

As shown in FIG. 6, when d/2p exceeds about 0.25, that is, d/p>about 0.5, the fractional band width is lower than about 5% even when d/p is adjusted. In contrast, in the case where d/2p ≤about 0.25, that is, d/p≤about 0.5, d/p is changed within the range, the fractional band width can be set to about 5% or higher, that is, a resonator having a high coupling coefficient is provided. In the case where d/2p is lower than or equal to about 0.12, that is, d/p is less than or equal to about 0.24, the fractional band width can be increased to about 7% or higher. In addition, when d/p is adjusted within the range, a resonator having a further wide fractional band width is obtained, so a resonator having a further high coupling coefficient is achieved. Therefore, it is discovered that, when d/p is set to, for example, about 0.5 or less, a resonator that uses bulk waves in the first thickness-shear mode with a high coupling coefficient can be provided.

At least one pair of electrodes may be one pair, and, in the case of one pair of electrodes, p is defined as the center-to-center distance between the adjacent electrode finger 3 and electrode finger 4. In the case of 1.5 pairs or more of electrodes, an average distance of the center-to-center distances between any adjacent electrode finger 3 and electrode finger 4 just needs to be defined as p.

For the thickness d of the piezoelectric layer 2 as well, when the piezoelectric layer 2 has thickness variations, an averaged value of the thickness only needs to be used.

Figure 7:
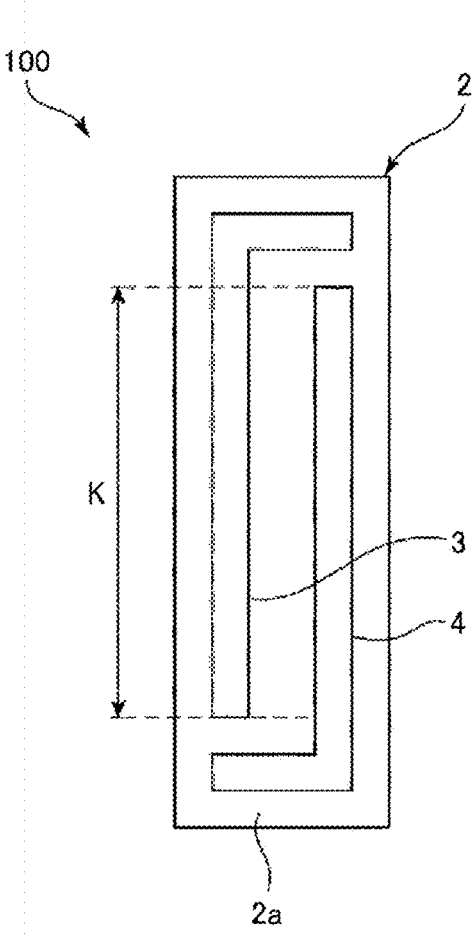
FIG. 7 is a plan view of an example in which a pair of electrodes is provided in an acoustic wave device according to a preferred embodiment of the present invention.

FIG. 7 is a plan view of an example in which a pair of electrodes is provided in the acoustic wave device according to the present preferred embodiment. In the acoustic wave device 101, one pair of electrodes having the electrode finger 3 and the electrode finger 4 is provided on the first principal surface 2a of the piezoelectric layer 2. In FIG. 7, K is an overlap width. As described above, in the acoustic wave device according to the present disclosure, the number of pairs of electrodes may be one. In this case as well, when d/p is, for example, less than or equal to about 0.5, bulk waves in the first thickness-shear mode can be effectively excited.

In the acoustic wave device 1, preferably, in the plurality of electrode fingers 3 and the plurality of electrode fingers 4, a metallization ratio MR of any adjacent electrode finger 3 and electrode finger 4 to the excitation region C that is a region in which the any adjacent electrode finger 3 and electrode finger 4 overlap when viewed in the opposed direction satisfy MR about 1.75 (d/p)+0.075. In this case, a spurious response is effectively reduced. This will be described with reference to FIGS. 8 and 9.

Figure 8:
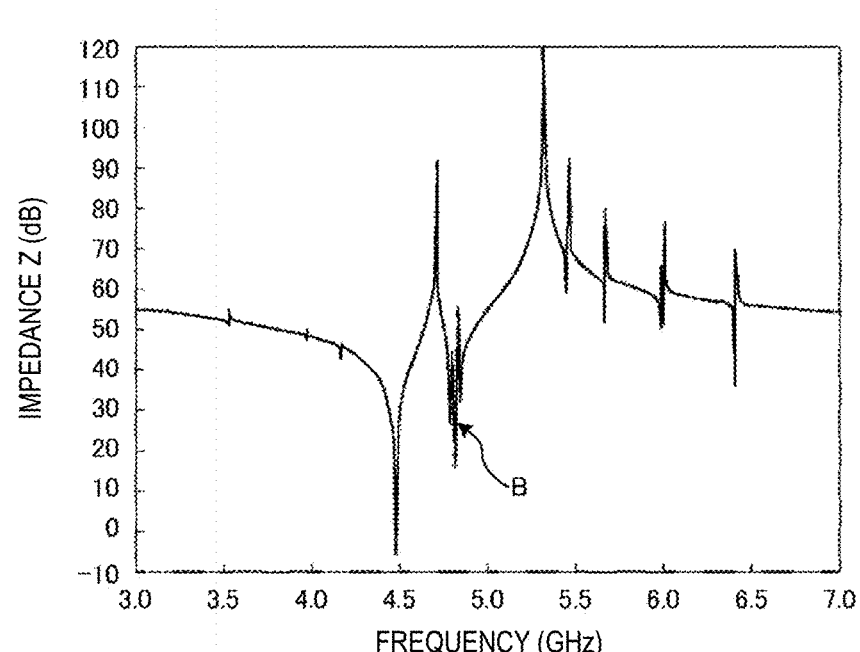
FIG. 8 is a reference graph of an example of the resonant characteristics of an acoustic wave device according to a preferred embodiment of the present invention.

FIG. 8 is a reference graph of an example of the resonant characteristics of the acoustic wave device according to the present preferred embodiment. The spurious response indicated by the arrow B appears between a resonant frequency and an anti-resonant frequency. Here, d/p was set to about 0.08, and the Euler angles of LiNbO$_3$ were set to (0°, 0°, 90°). The metallization ratio MR was set to about 0.35.

The metallization ratio MR will be described with reference to FIG. 1B. In the electrode structure of FIG. 1B, when focusing on one pair of electrode finger 3 and electrode finger 4, it is assumed that only the one pair of electrode finger 3 and electrode finger 4 is provided. In this case, the portion surrounded by the alternate long and short dashed line is an excitation region C. The excitation region C includes, when the electrode finger 3 and the electrode finger 4 are viewed in the direction orthogonal or substantially orthogonal to the length direction of the electrode fingers 3 and electrode fingers 4, that is, the opposed direction, a region of the electrode finger 3, overlapping the electrode finger 4, a region of the electrode finger 4, overlapping the electrode finger 3, and a region in which the electrode finger 3 and the electrode finger 4 overlap in a region between the electrode finger 3 and the electrode finger 4. Then, the area of the electrode finger 3 and the electrode finger 4 in the excitation region C to the area of the excitation region C is a metallization ratio MR. In other words, the metallization ratio MR is the ratio of the area of a metallization portion to the area of the excitation region C.

When a plurality of pairs of electrode finger 3 and electrode finger 4 are provided, the ratio of a metallization portion included in the total excitation region C to the total area of the excitation region C just needs to be set for MR.

Figure 9:
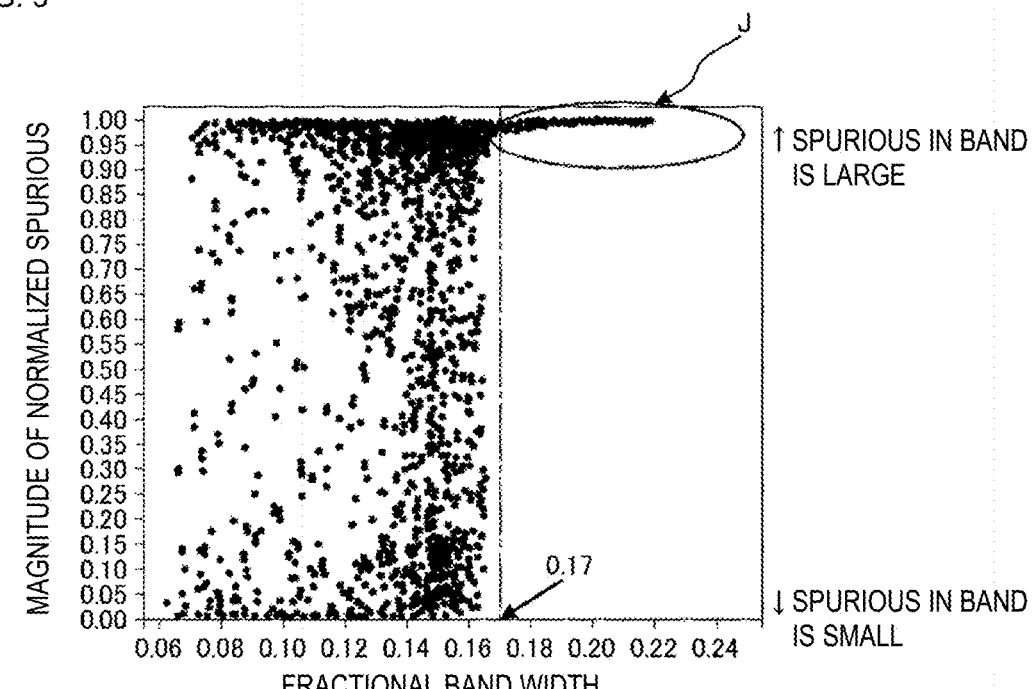
FIG. 9 is a graph that illustrates the relationship between a fractional band width in a case where a large number of acoustic wave resonators are provided and a phase rotation amount of impedance of a spurious response normalized by 180 degrees as a magnitude of the spurious response in an acoustic wave device according to a preferred embodiment of the present invention.

FIG. 9 is a graph that illustrates the relationship between a fractional band width in the case where a large number of acoustic wave resonators are provided and a phase rotation amount of impedance of a spurious response normalized by about 180 degrees as the magnitude of spurious in the acoustic wave device according to the present preferred embodiment. For fractional band width, the film thickness of the piezoelectric layer and the dimensions of the electrode fingers 3 and electrode fingers 4 were variously changed and adjusted. FIG. 9 is a result in the case where the piezoelectric layer 2 made of, for example, Z-cut LiNbO₃ is used, and similar tendency is obtained when a piezoelectric layer 2 with another cut angle is used as well.

In a region surrounded by the ellipse J in FIG. 9, the spurious response is about 1.0 and large. As is apparent from FIG. 9, when the fractional band width exceeds about 0.17, that is, about 17%, a large spurious response having a spurious level of greater than or equal to about one appears in a pass band even when parameters including the fractional band width are changed. In other words, as in the case of the resonant characteristics shown in FIG. 8, a large spurious response indicated by the arrow B appears in the band. Thus, the fractional band width is preferably, for example, lower than or equal to about 17%. In this case, a spurious response can be reduced by adjusting the film thickness of the piezoelectric layer 2, the dimensions of the electrode fingers 3 and electrode fingers 4, and the like.

Figure 10:
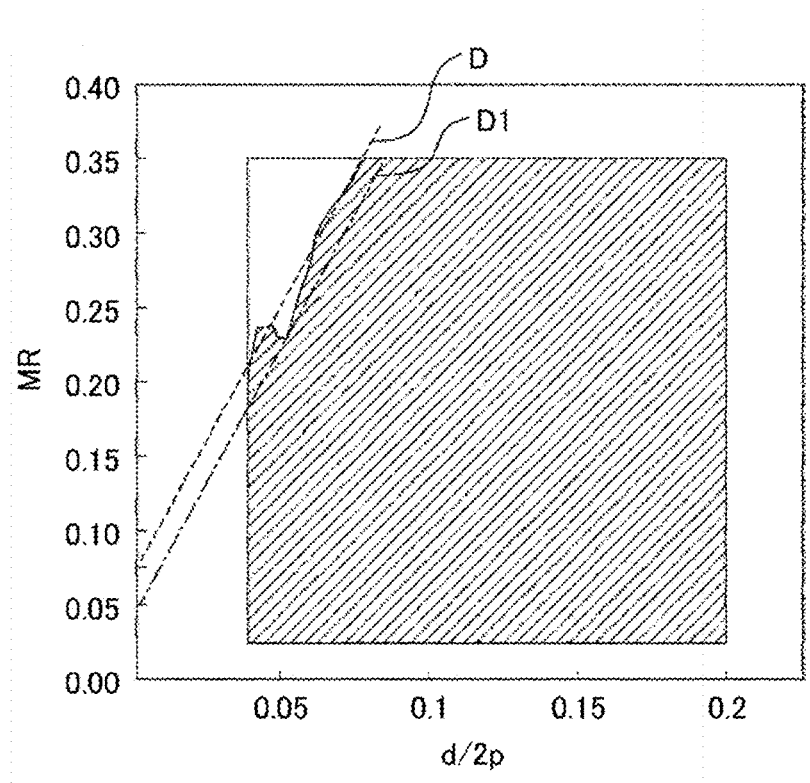
FIG. 10 is a graph that illustrates the relationship among $d/2p$, metallization ratio MR, and fractional band width.

FIG. 10 is a graph that illustrates the relationship among d/2p, metallization ratio MR, and fractional band width. In the acoustic wave device 1 according to the present preferred embodiment, various acoustic wave devices 1 of which d/2p and MR were different were provided, and fractional band widths were measured. The hatched portion to the right-hand side of the dashed line D in FIG. 10 is a region in which the fractional band width is lower than or equal to about 17%. A boundary between the hatched region and a non-hatched region is expressed by MR=about 3.5(d/2p)+0.075. In other words, MR=about 1.75(d/p)+0.075. Therefore, preferably, for example, MR about 1.75(d/p)+ 0.075. In this case, the fractional band width is easily set to about 17% or lower. More preferably, this is the region to the right-hand side of MR=about 3.5(d/2p)+0.05 indicated by the alternate long and short dashed line D1 in FIG. 10. In other words, when MR about 1.75(d/p)+0.05, the fractional band width is reliably set to about 17% or lower.

Figure 11:
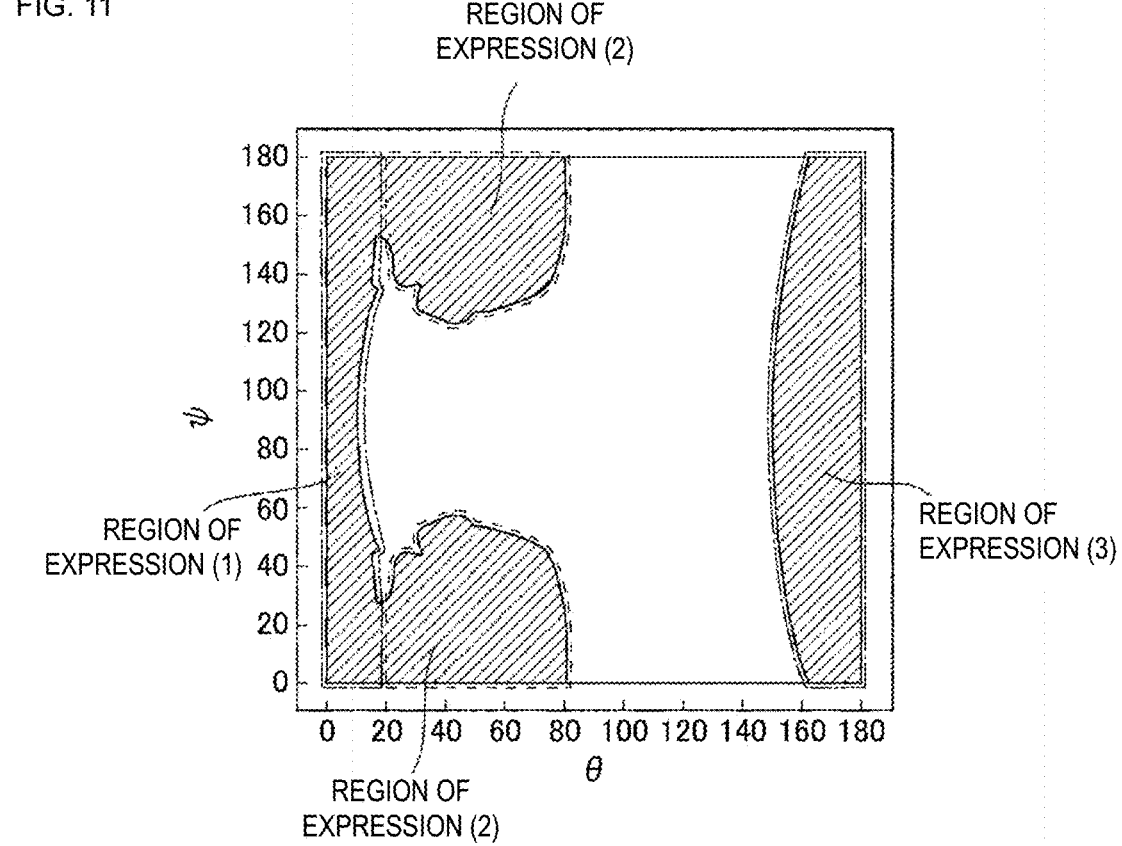
FIG. 11 is a diagram that illustrates a map of a fractional band width for the Euler angles $(0°, \theta, \psi)$ of $LiNbO_3$ when $d/p$ is brought close to zero without limit.

FIG. 11 is a diagram illustrating a map of a fractional band width for the Euler angles (0°, θ, ψ) of LiNbO₃ when d/p is brought close to zero without limit. The hatched portions in FIG. 11 are regions in which a fractional band width of at least about 5% or higher is obtained, when the range of the regions is approximated, the range is expressed by the following expression (1), expression (2), and expression (3).

$$(0°\pm10°, 0° \text{ to } 20°, \text{ any } \psi) \quad (1)$$

$$(0°\pm10°, 20° \text{ to } 80°, 0° \text{ to } 60° (1-(\theta-50)^2/900)^{1/2}) \text{ or } \\ (0°\pm10°, 20° \text{ to } 80°, [180°-60°(1-(\theta-50)^2/900) \\ ^{1/2}] \text{ to } 180° \quad (2)$$

$$(0°\pm10°, [180°-30°(1-(\psi-90)^2/8100)^{1/2}] \text{ to } 180°, \\ \text{ any } \psi) \quad (3)$$

Therefore, in the case of the range of Euler angles of the above expression (1), expression (2), or expression (3), the fractional band width is sufficiently widened, and it is preferable.

Figure 12:
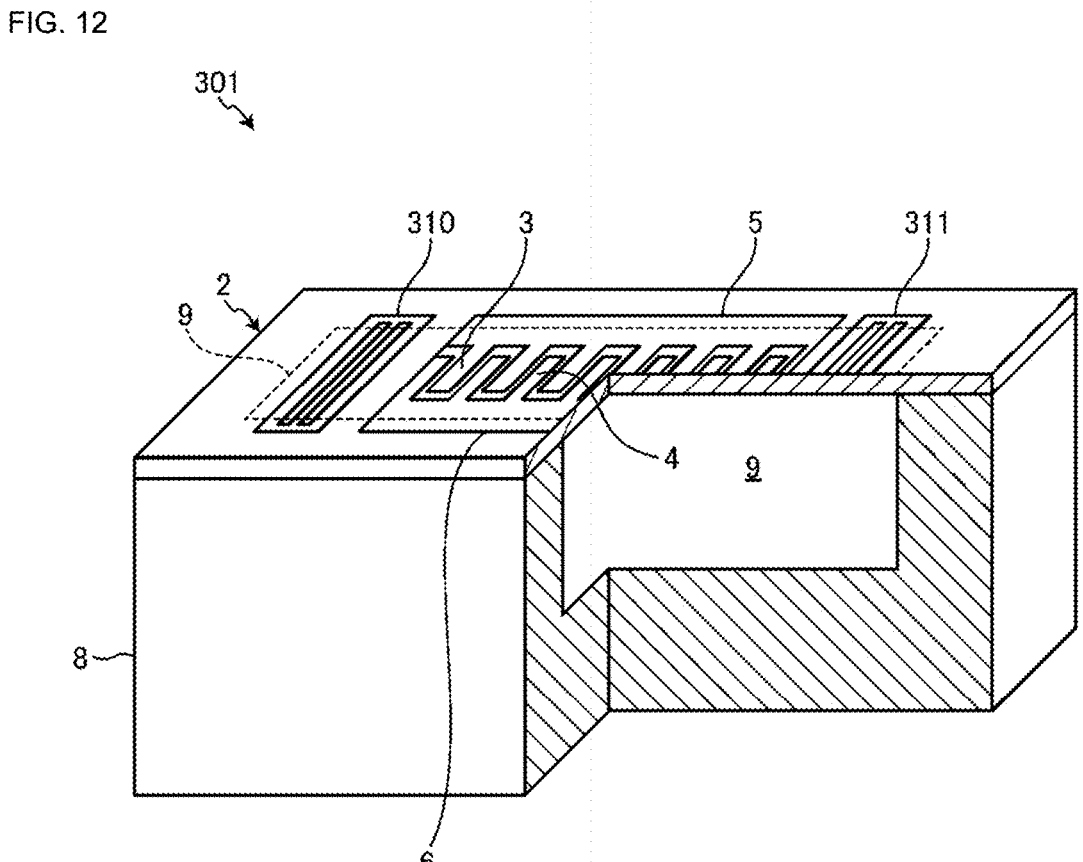
FIG. 12 is a partially cutaway perspective view for illustrating an acoustic wave device according to a preferred embodiment of the present invention.

FIG. 12 is a partially cutaway perspective view for illustrating the acoustic wave device according to the present preferred embodiment. In FIG. 12, the outer periphery of the cavity portion 9 is indicated by dashed line. The acoustic wave device according to the present preferred embodiment may be structured or configured to use plate waves. In this case, as shown in FIG. 12, the acoustic wave device 301 includes reflectors 310, 311. The reflectors 310, 311 are respectively provided on both sides of the electrode fingers 3, 4 on the piezoelectric layer 2 in an acoustic wave propagation direction. In the acoustic wave device 301, Lamb waves serving as plate waves are excited when an alternating-current electric field is applied to the electrode fingers 3, 4 above the cavity portion 9. Since the reflectors 310, 311 are respectively provided on both sides, resonant characteristics based on the Lamb waves as plate waves are obtained. As described above, in the acoustic wave devices 1, 101, bulk waves in a first thickness-shear mode are used. In addition, in the acoustic wave devices 1, 101, the electrode finger 3 and the electrode finger 4 are adjacent electrodes, and, when the thickness of the piezoelectric layer 2 is d and the center-to-center distance between the electrode finger 3 and the electrode finger 4 is p, d/p is, for example, less than or equal to about 0.5. Thus, even when the size of the acoustic wave device reduces, the quality factor is improved.

In the acoustic wave devices 1, 101, the piezoelectric layer 2 is made of, for example, lithium niobate or lithium tantalate. The electrode fingers 3 and the electrode fingers 4, opposed in the direction that intersects with the thickness direction of the piezoelectric layer 2, are provided on the first principal surface 2a or second principal surface 2b of the piezoelectric layer 2. The electrode fingers 3 and the electrode fingers 4 are preferably covered with a protective film.

First Preferred Embodiment

Figure 13:
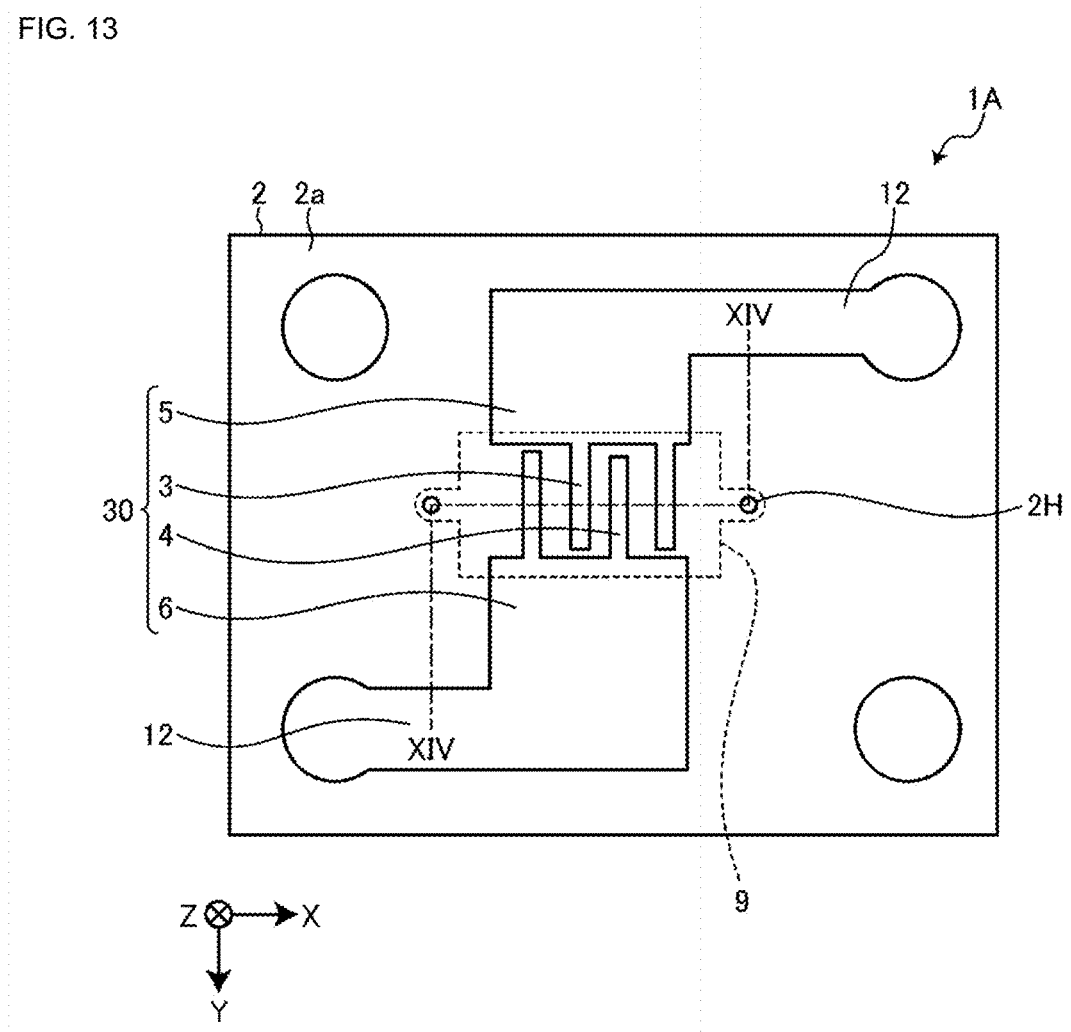
FIG. 13 is a plan view of an acoustic wave device according to a first preferred embodiment of the present invention.

FIG. 13 is a plan view of an acoustic wave device according to a first preferred embodiment of the present invention.

Figure 14:
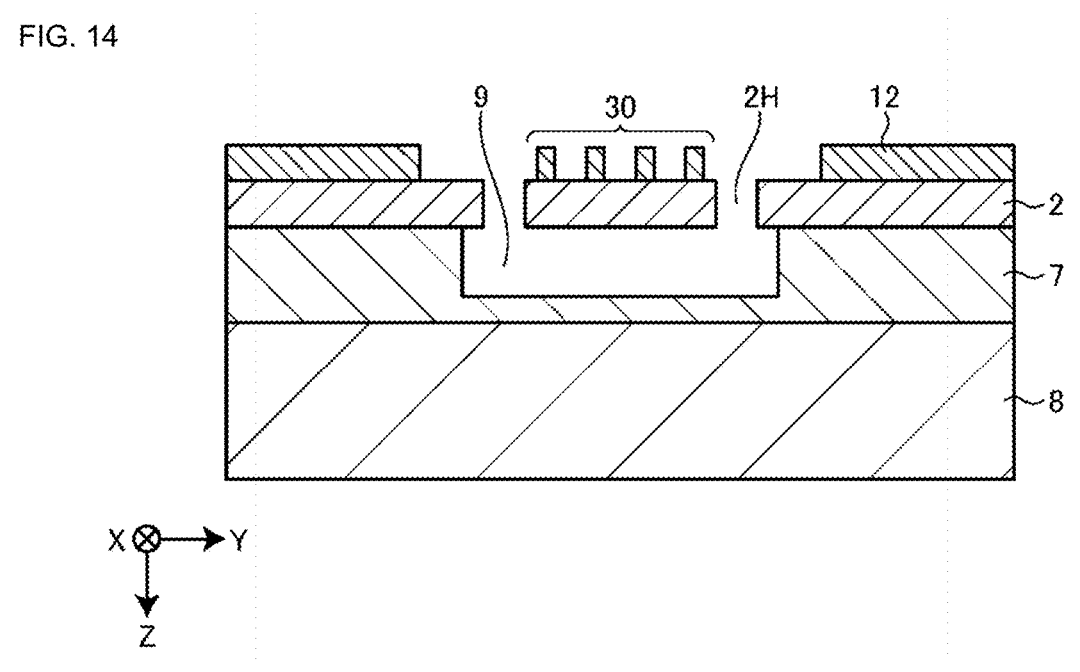
Figure 15:
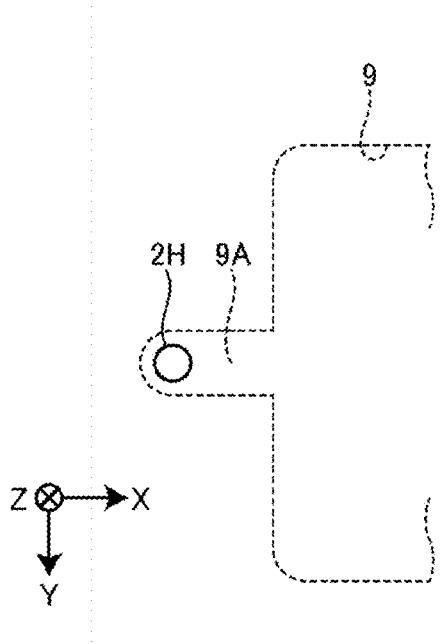
FIG. 15 is a plan view around a through-hole according to the first preferred embodiment of the present invention.

FIG. 14 is a cross-sectional view taken along the line XIV-XIV in FIG. 13. FIG. 15 is a plan view around a through-hole according to the first preferred embodiment. In the example of FIG. 13, the first busbar electrode 5 and the second busbar electrode 6 are respectively connected to wires 12 provided on the first principal surface 2a of the piezoelectric layer 2. This configuration is merely an example.

As shown in FIGS. 13 and 14, in an acoustic wave device 1A according to the first preferred embodiment, the cavity portion 9 is provided on a piezoelectric layer 2-side surface of the support substrate 8 in the Z direction. The cavity portion 9 is provided so as to at least partially overlap the functional electrode 30 in a plan view in the Z direction. As shown in FIG. 14, the cavity portion 9 is provided in a portion of the intermediate layer 7 and is a space surrounded by the piezoelectric layer 2 and the intermediate layer 7. The cavity portion 9 may be a space surrounded by the piezoelectric layer 2, the support substrate 8, and the intermediate layer 7. The support substrate 8 is, for example, a silicon substrate. The intermediate layer 7 is, for example, silicon oxide. The support substrate 8 and the intermediate layer 7 define a support member. The piezoelectric layer includes, for example, lithium niobate or lithium tantalate. The piezoelectric layer 2 may include, for example, lithium niobate or lithium tantalate, and inevitable impurities. Here, the functional electrode 30 is an interdigital transducer electrode including the opposed first busbar electrode 5 and second busbar electrode 6, the electrode fingers 3 connected to the first busbar electrode 5, and the electrode fingers 4 connected to the second busbar electrode 6.

As shown in FIG. 13, in the acoustic wave device 1A according to the first preferred embodiment, through-holes 2H extending through the piezoelectric layer 2 are provided in the piezoelectric layer 2 at positions that overlap the cavity portion 9 in a plan view in the Z direction. The through-holes 2H are etching holes for etching a sacrificial layer embedded in a portion that will be the cavity portion 9. An etchant is injected from the first principal surface 2a of the piezoelectric layer 2.

Figure 16:
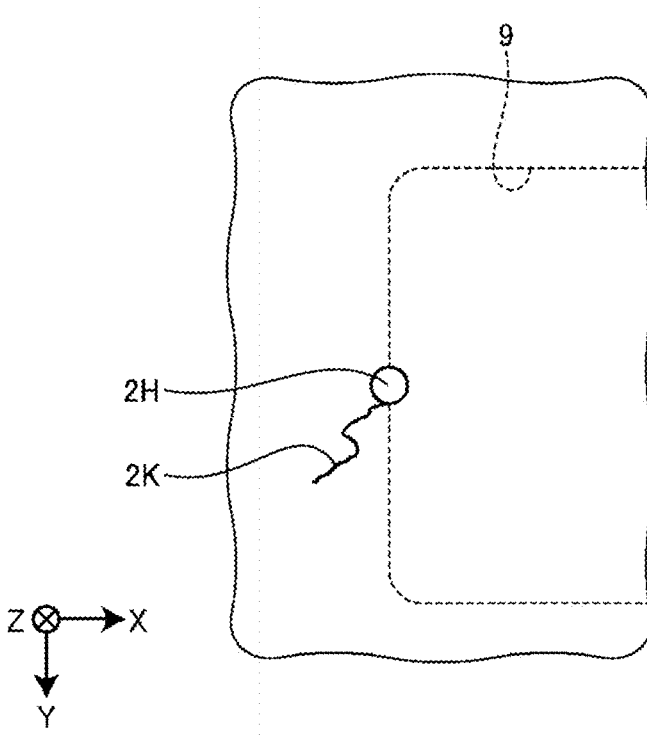
FIG. 16 is a plan view around a through-hole according to a comparative example.

FIG. 15 is a plan view around the through-hole according to the first preferred embodiment. FIG. 16 is a plan view around a through-hole according to a comparative example. As shown in FIG. 15, the cavity portion 9 is connected to an extended passage 9A. The cavity portion 9 and the extended passage 9A define a space formed by etching the sacrificial layer. When viewed in a plan view in the Z direction, the outer edge of the through-hole 2H is provided inside the outer edge of the extended passage 9A. In contrast, as shown in FIG. 16, when the through-hole 2H according to the comparative example is viewed in a plan view in the Z direction, the outer edge of the through-hole 2H is provided so as to overlap the edge of the cavity portion 9.

In the comparative example, there is a possibility that stress concentration occurs at the outer edge of the through-hole 2H, so that there is a possibility that a crack starting from the through-hole 2H occurs in the piezoelectric layer 2. In contrast, at least a portion of the outer edge of the through-hole 2H according to the first preferred embodiment has a curved shape. Thus, a crack of the piezoelectric layer 2 is reduced or prevented. In the first preferred embodiment, the through-hole 2H has a circular or substantially circular shape. The outer edge of the extended passage 9A also has a curved shape, and around an end portion, a portion where the distance between the outer edge of the extended passage 9A and the outer edge of the through-hole 2H is constant is continuously provided. Thus, in a stress distribution applied to the piezoelectric layer 2, a stress concentration is less likely to occur. Here, it is assumed that a state where the distance between the outer edge of the extended passage 9A and the outer edge of the through-hole 2H is constant includes an error of about ±1 μm to about ±5 μm. The portion where the distance between the outer edge of the space and the outer edge of the through-hole is constant is preferably, for example, higher than or equal to about 30% of the outer edge of the through-hole from the viewpoint of reducing or preventing a stress concentration in a stress distribution applied to the piezoelectric layer 2.

Figure 17:
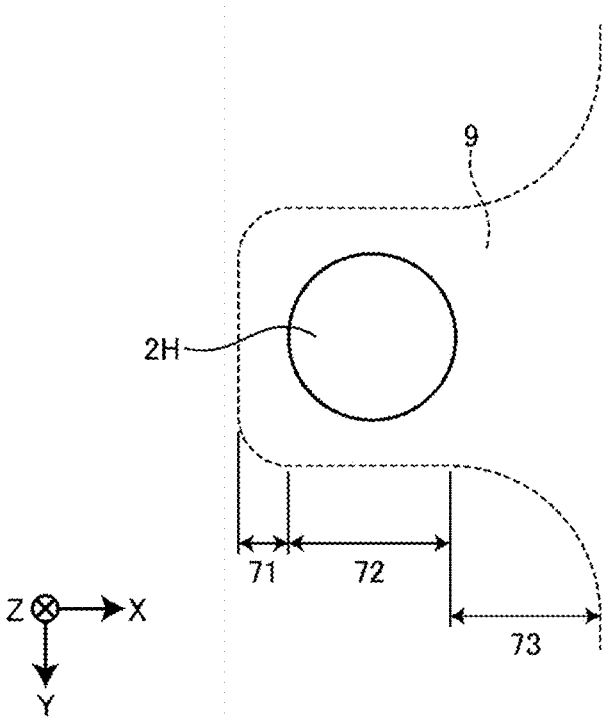
FIG. 17 is a plan view around a through-hole according to a modification of the first preferred embodiment of the present invention.

FIG. 17 is a plan view around a through-hole according to a modification of the first preferred embodiment. When viewed in a plan view in the Z direction, the outer edge of the through-hole 2H is provided inside the outer edge of the extended passage 9A. As shown in FIG. 17, the outer edge of the extended passage 9A includes a first curved portion 71, a straight portion 72, and a second curved portion 73. For example, since the curvature of the first curved portion 71 is equivalent to the curvature of the through-hole 2H, a stress concentration is reduced or prevented in a stress distribution applied to the piezoelectric layer 2, so a crack starting from the through-hole 2H of the piezoelectric layer 2 is reduced or prevented.

As described above, the acoustic wave device 1A according to the first preferred embodiment includes the support substrate 8 having a thickness in the first direction, the piezoelectric layer 2 provided in the first direction with respect to the support substrate 8, and the functional electrode 30 provided in the first direction with respect to the piezoelectric layer 2. The functional electrode 30 includes the plurality of electrode fingers 3 extending in the second direction orthogonal or substantially orthogonal to the first direction, and the plurality of electrode fingers 4 each opposed to any one of the plurality of electrode fingers 3 in the third direction orthogonal or substantially orthogonal to the first direction and the second direction and extending in the second direction. The cavity portion (space) 9 is provided at a position that at least partially overlaps the functional electrode 30 between the support substrate 8 and the piezoelectric layer 2 in a plan view in the first direction. At least one through-hole 2H extends through the piezoelectric layer 2, and the through-hole 2H communicates with the cavity portion 9 through the extended passage 9A. When viewed in the Z direction, the through-hole 2H is located inside the outer edge of the extended passage 9A.

Thus, in a stress distribution applied to the piezoelectric layer 2, a stress concentration is less likely to occur. As a result, a crack starting from the through-hole 2H in the piezoelectric layer 2 is reduced or prevented.

In a preferred embodiment of the present invention, where, of the plurality of electrode fingers 3 and the plurality of electrode fingers 4, the center-to-center distance between any adjacent electrode finger 3 and electrode finger 4 is p, the thickness of the piezoelectric layer 2 is less than or equal to about 2p. Thus, the size of the acoustic wave device 1 is reduced, and the quality factor is improved.

In a preferred embodiment, the piezoelectric layer 2 includes, for example, lithium niobate or lithium tantalate. Thus, the acoustic wave device with which good resonant characteristics are obtained is provided.

In a preferred embodiment, Euler angles ($\varphi$, $\theta$, $\psi$) of the lithium niobate or the lithium tantalate that is a component of the piezoelectric layer 2 fall within a range of the following expression (1), expression (2), or expression (3). In this case, a fractional band width is sufficiently widened.

$$(0°±10°, 0° \text{ to } 20°, \text{any } \psi) \tag{1}$$

$$
\begin{aligned}
&(0°±10°, 20° \text{ to } 80°, 0° \text{ to } 60° \ (1-(\theta-50)^2/900)^{1/2}) \text{ or} \\
&\quad (0°±10°, \quad 20° \quad \text{to} \quad 80°, \quad [180°-60° \\
&\quad (1-(\theta-50)^2/900)^{1/2}] \text{ to } 180°
\end{aligned}
\tag{2}
$$

$$
\begin{aligned}
&(0°±10°, [180°-30°(1-(\psi-90)^2/8100)^{1/2}] \text{ to } 180°, \\
&\quad \text{any } \psi)
\end{aligned}
\tag{3}
$$

In a preferred embodiment, the acoustic wave device 1 is configured to be capable of using bulk waves in a thickness-shear mode. Thus, a coupling coefficient increases, so the acoustic wave device with which good resonant characteristics are obtained is provided.

In a preferred embodiment, where the thickness of the piezoelectric layer 2 is d and the center-to-center distance between the adjacent electrode finger 3 and electrode finger 4 is p, d/p≤about 0.5. Thus, the size of the acoustic wave device 1 is reduced, and the quality factor is improved.

In a preferred embodiment, d/p is less than or equal to about 0.24. Thus, the size of the acoustic wave device 1 is reduced, and the quality factor is improved.

In a preferred embodiment, a region in which the adjacent electrode finger 3 and electrode finger 4 overlap in a direction in which the electrode finger 3 and the electrode finger 4 are opposed is the excitation region C, and, where a metallization ratio of the plurality of electrode fingers 3 and the plurality of electrode fingers 4 to the excitation region C is MR, MR about 1.75(d/p)+0.075 is satisfied. In this case, the fractional band width is reliably set to about 17% or lower.

In a preferred embodiment, the acoustic wave device 301 may be configured to be capable of using plate waves. Thus, the acoustic wave device with which good resonant characteristics are obtained is provided.

Second Preferred Embodiment

Figure 18:
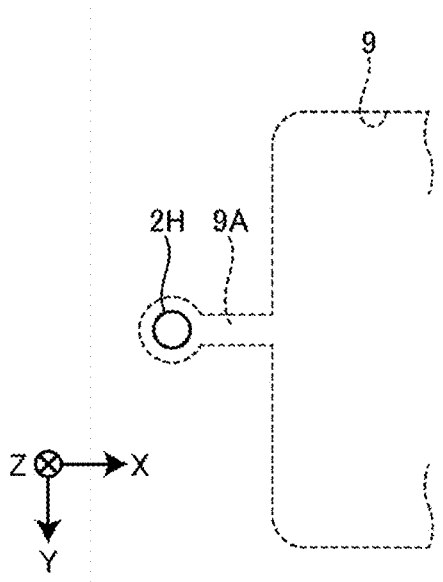
FIG. 18 is a plan view of an acoustic wave device according to a second preferred embodiment of the present invention.

FIG. 18 is a plan view of an acoustic wave device according to a second preferred embodiment of the present invention. The second preferred embodiment differs from the first preferred embodiment in that the shape of the extended passage 9A is different.

In the extended passage 9A according to the second preferred embodiment, the length of a portion around the through-hole 2H in the Y direction is greater than the length of a portion between the through-hole 2H and the cavity portion 9 in the Y direction. Thus, a curved portion of the shape of the portion around the through-hole 2H can be increased. As a result, the portion where the distance between the outer edge of the extended passage 9A and the outer edge of the through-hole 2H is constant may be, for example, greater than or equal to about 50% of the outer edge of the through-hole 2H.

Therefore, in a stress distribution applied to the piezoelectric layer 2, a stress concentration is further reduced or prevented, so a crack starting from the through-hole 2H in the piezoelectric layer 2 is reduced or prevented.

Figure 19:
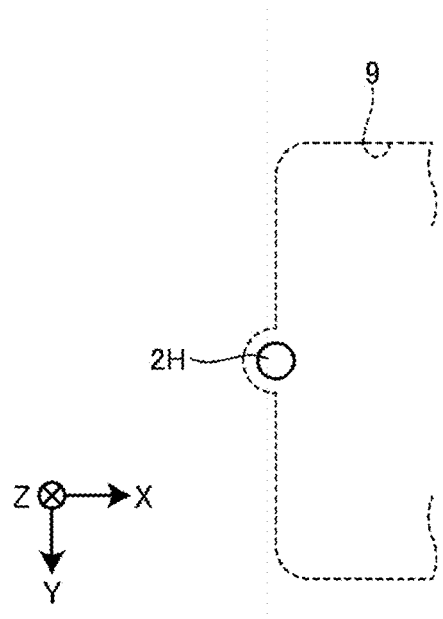
FIG. 19 is a plan view of an acoustic wave device according to a first modification of the second preferred embodiment of the present invention.

FIG. 19 is a plan view of an acoustic wave device according to a first modification of the second preferred embodiment. In the first modification of the second preferred embodiment, a space in the intermediate layer 7 around the through-hole 2H partially projects from the cavity portion 9 in a semicircular or substantially semicircular shape when viewed in the Z direction. The outer edge of the through-hole 2H is provided inside the outer edge of the space projecting from the cavity portion 9 in a circular or substantially circular shape.

Figure 20:
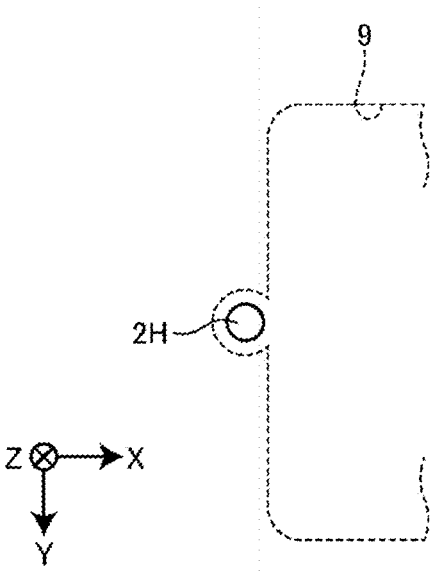
FIG. 20 is a plan view of an acoustic wave device according to a second modification of the second preferred embodiment of the present invention.

FIG. 20 is a plan view of an acoustic wave device according to a second modification of the second preferred embodiment. In the second modification of the second preferred embodiment, a space in the intermediate layer 7 around the through-hole 2H partially projects from the cavity portion 9 when viewed in the Z direction. The outer edge of the through-hole 2H is, for example, provided inside the outer edge of the space projecting by about ⅔ to about ¾ of the circumference from the cavity portion 9.

Figure 21:
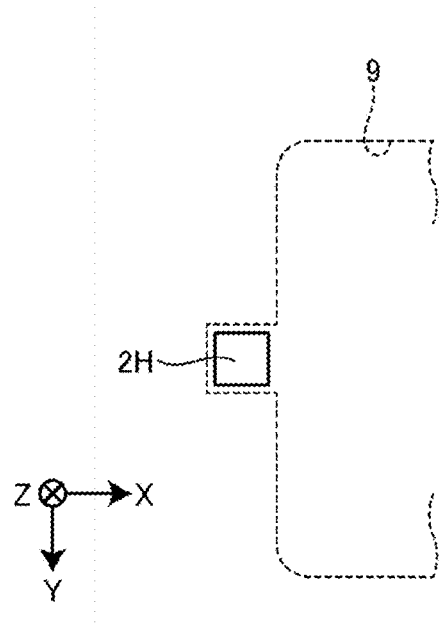
FIG. 21 is a plan view of an acoustic wave device according to a third modification of the second preferred embodiment of the present invention.

FIG. 21 is a plan view of an acoustic wave device according to a third modification of the second preferred embodiment. In the third modification of the second preferred embodiment, the through-hole 2H has a rectangular or substantially rectangular shape. In addition, a space in the intermediate layer 7 around the through-hole 2H partially projects from the cavity portion 9 when viewed in the Z direction. The outer edge of the through-hole 2H is, for example, provided inside the outer edge of the space, of which the rectangular or rectangular shape projects from the cavity portion 9.

Figure 22:
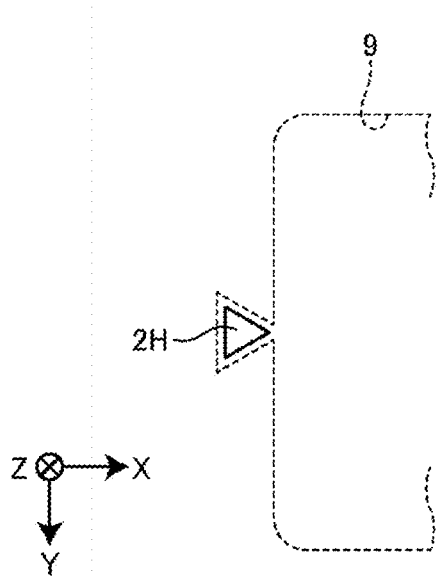
FIG. 22 is a plan view of an acoustic wave device according to a fourth modification of the second preferred embodiment of the present invention.

FIG. 22 is a plan view of an acoustic wave device according to a fourth modification of the second preferred embodiment. In the fourth modification of the second preferred embodiment, the through-hole 2H has a triangular or substantially triangular shape. In addition, a space in the intermediate layer 7 around the through-hole 2H partially projects from the cavity portion 9 when viewed in the Z direction. The outer edge of the through-hole 2H is, for example, provided inside the outer edge of the space, of which the triangular shape projects from the cavity portion 9.

Figure 23:
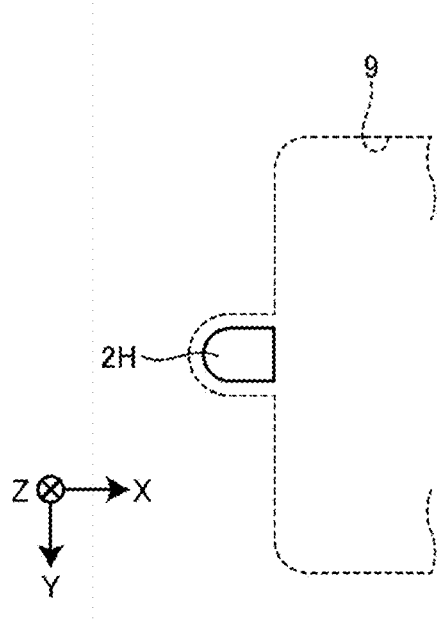
FIG. 23 is a plan view of an acoustic wave device according to a fifth modification of the second preferred embodiment.

FIG. 23 is a plan view of an acoustic wave device according to a fifth modification of the second preferred embodiment. In the fifth modification of the second preferred embodiment, the through-hole 2H has a shape defined by a combination of a curve and corner portions. In addition, a space in the intermediate layer 7 around the through-hole 2H partially projects from the cavity portion 9 when viewed in the Z direction. The outer edge of the through-hole 2H is similar to the outer edge of the space and is provided inside the outer edge of the space projecting from the cavity portion 9.

Figure 24:
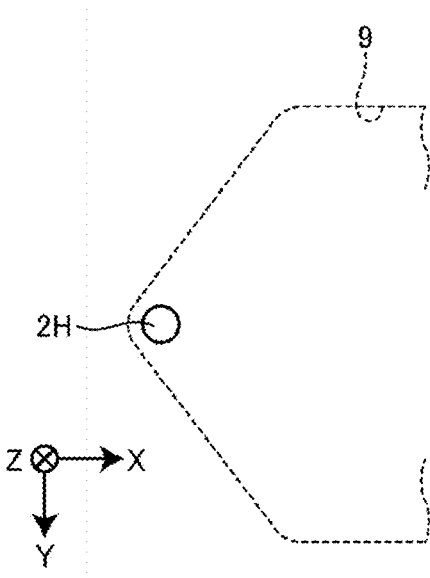
FIG. 24 is a plan view of an acoustic wave device according to a sixth modification of the second preferred embodiment of the present invention.

FIG. 24 is a plan view of an acoustic wave device according to a sixth modification of the second preferred embodiment. In the sixth modification of the second preferred embodiment, the through-hole 2H has a circular or substantially circular shape. The outer edge of the through-hole 2H is provided inside the outer edge of the cavity portion 9.

Figure 25:
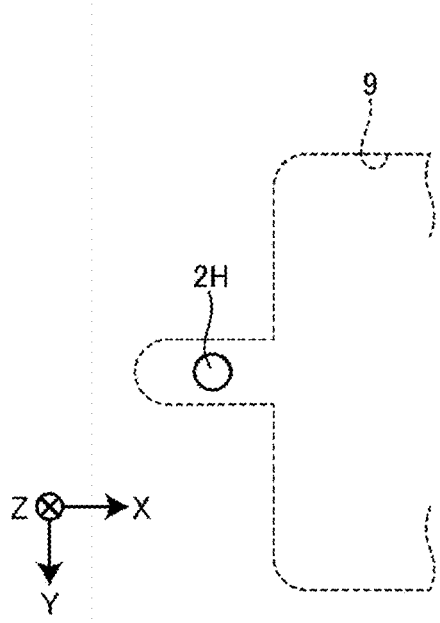
FIG. 25 is a plan view of an acoustic wave device according to a seventh modification of the second preferred embodiment of the present invention.

FIG. 25 is a plan view of an acoustic wave device according to a seventh modification of the second preferred embodiment. In the seventh modification of the second preferred embodiment, the through-hole 2H has a circular or substantially circular shape. A space in the intermediate layer 7 around the through-hole 2H partially projects from the cavity portion 9 when viewed in the Z direction. The through-hole 2H does not always need to be provided at an end portion of the space in the intermediate layer 7.

Third Preferred Embodiment

Figure 26:
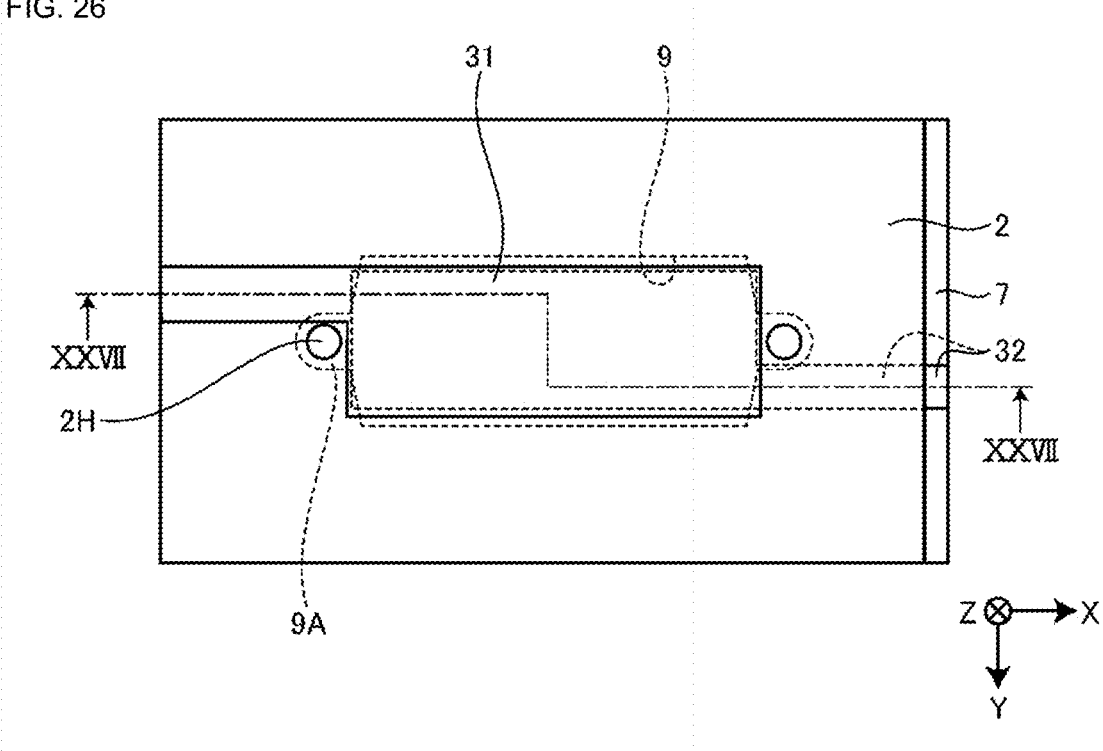
FIG. 26 is a plan view of an acoustic wave device according to a third preferred embodiment of the present invention.

FIG. 26 is a plan view of an acoustic wave device according to a third preferred embodiment of the present invention.

Figure 27:
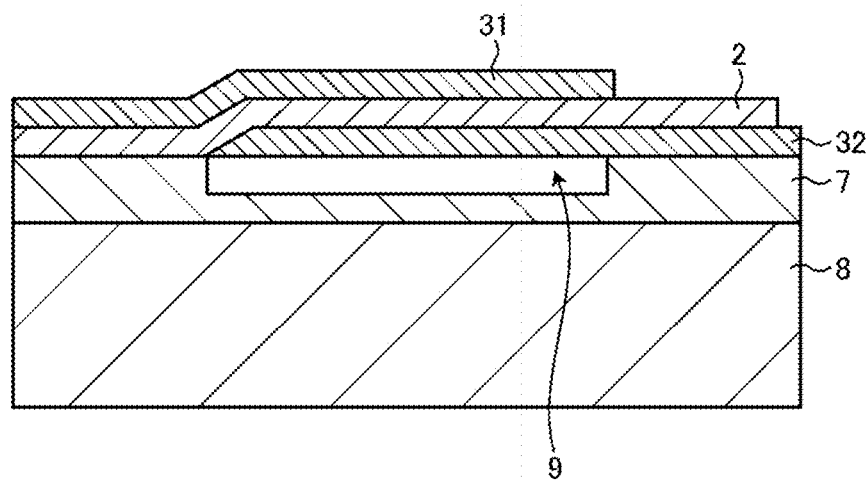
FIG. 27 is a cross-sectional view taken along the line XIV-XIV in FIG. 26.

FIG. 27 is a cross-sectional view taken along the line XXVII-XXVII in FIG. 26. The functional electrode 30 according to the third preferred embodiment includes an upper electrode 31 and a lower electrode 32. The upper electrode 31 and the lower electrode 32 sandwich the piezoelectric layer 2 in the thickness direction. The acoustic wave device according to the third preferred embodiment may also be called a bulk acoustic wave element (BAW element).

The through-holes 2H are etching holes to etch a sacrificial layer embedded in a portion that will be the cavity portion 9. Each of the through-holes 2H has a circular or substantially circular shape. The outer edge of the through-hole 2H is provided inside the outer edge of the cavity portion 9.

Therefore, in a stress distribution applied to the piezoelectric layer 2, a stress concentration is further reduced or prevented, so a crack starting from the through-hole 2H in the piezoelectric layer 2 is reduced or prevented.

Evaluation Example

As in the case of the comparative example shown in FIG. 16, a model in which a portion of the outer edge of the through-hole was provided outside the outer edge of the space when viewed in a plan view was prepared as Comparative Example.

A model in which the outer edge of the through-hole was provided inside the outer edge of the space when viewed in a plan view as shown in FIG. 15 was prepared as Example 1.

A model in which the outer edge of the through-hole was provided inside the outer edge of the space when viewed in a plan view as shown in FIG. 18 was prepared as Example 2.

The evaluation results of simulations are shown in Table 1.

TABLE 1

|  | Maximum Mises Stress (GPa) |
| --- | --- |
| Example 1 | 0.847 |
| Example 2 | 0.650 |
| Comparative Example | 1.465 |

As shown in Table 1, Example 1 is smaller in maximum Mises stress than Comparative Example 1. Since the outer edge of the through-hole is provided inside the outer edge of the space, a stress applied to the piezoelectric layer 2 is reduced.

As shown in Table 1, Example 2 is smaller in maximum Mises stress than Example 1. As a region in which the distance between the outer edge of the space and the outer edge of the through-hole 2H is the same or substantially the same increases in a plan view in the Z direction, a stress applied to the piezoelectric layer 2 is reduced.

Subsequently, when viewed in a plan view as shown in FIG. 18, a model in which the outer edge of the through-hole was provided inside the outer edge of the space was prepared, and simulations were performed under the condition that the size of the outer edge of the through-hole 2H was fixed to about 14 μm and the size of the outer edge of the space was changed.

Figure 28:
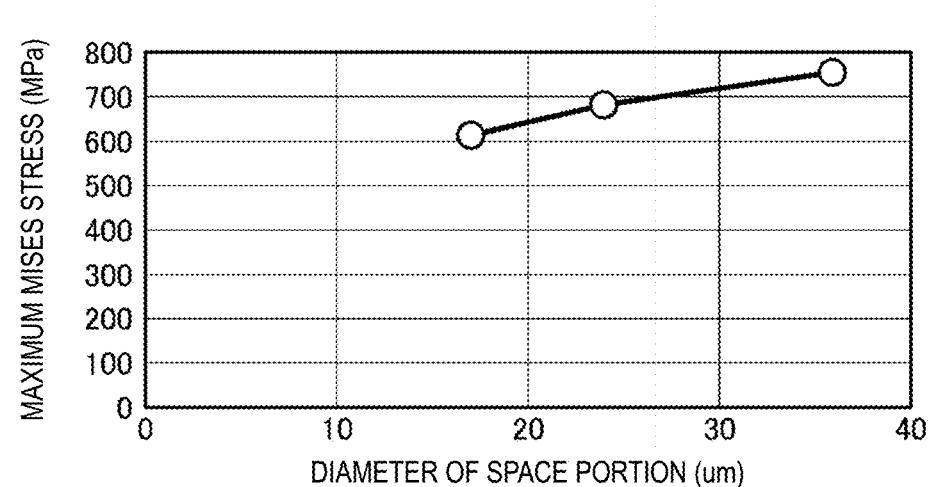
FIG. 28 is a graph that illustrates the relationship between an outer edge of a space and a maximum Mises stress.

FIG. 28 is a graph that illustrates the relationship between an outer edge of a space and a maximum Mises stress. The diameter of the outer edge of a pseudo space is obtained from a radius of curvature of a curved portion the same as or similar to the through-hole 2H, and the diameter of the outer edge of the space is changed. As shown in FIG. 28, as the diameter of the outer edge of the space increases, the maximum Mises stress increases.

Figure 29:
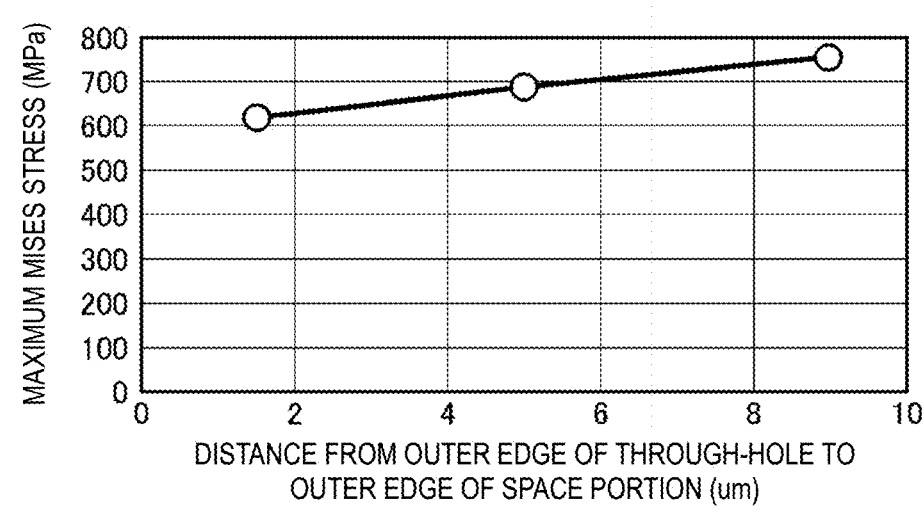
FIG. 29 is a graph that illustrates the relationship between a distance from an outer edge of a through-hole to an outer edge of a space and a maximum Mises stress.

FIG. 29 is a graph that illustrates the relationship between a distance from an outer edge of a through-hole to an outer edge of a space and a maximum Mises stress. FIG. 29 is that the evaluation results of FIG. 28 are replaced with the relationship between a distance from the outer edge of the through-hole to the outer edge of the space and a maximum Mises stress. As the distance from the outer edge of the through-hole to the outer edge of the space reduces, the maximum Mises stress reduces.

Fourth Preferred Embodiment

Figure 30:
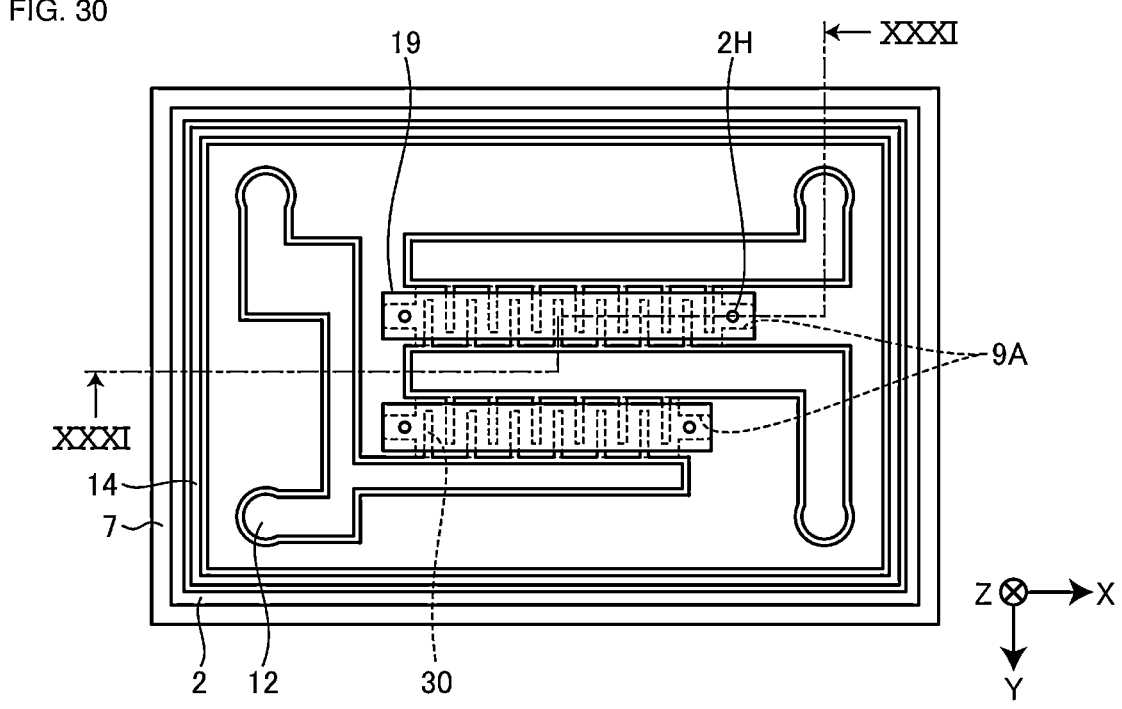
FIG. 30 is a plan view of a first principal surface side of a first substrate of an acoustic wave device according to a fourth preferred embodiment of the present invention.
Figure 31:
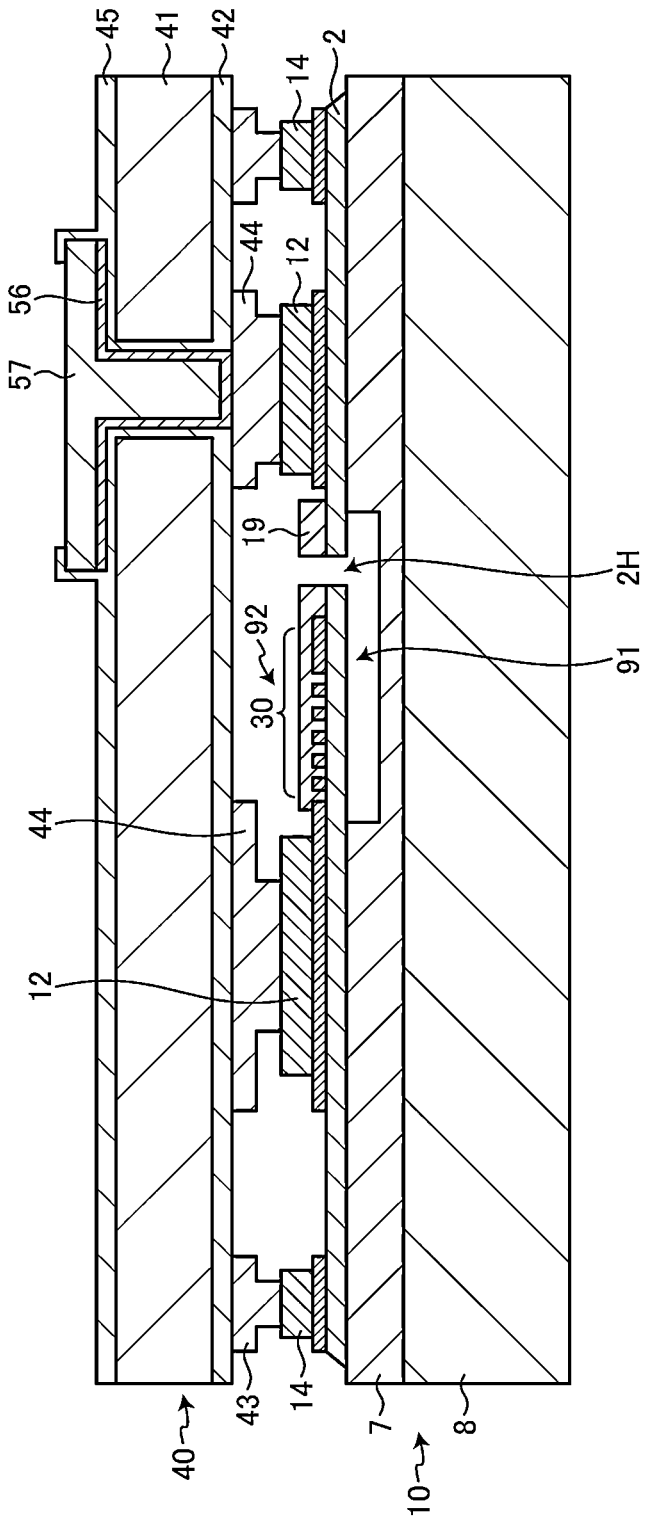
FIG. 31 is a cross-sectional view of an acoustic wave device according to the fourth preferred embodiment of the present invention.
Figure 32:
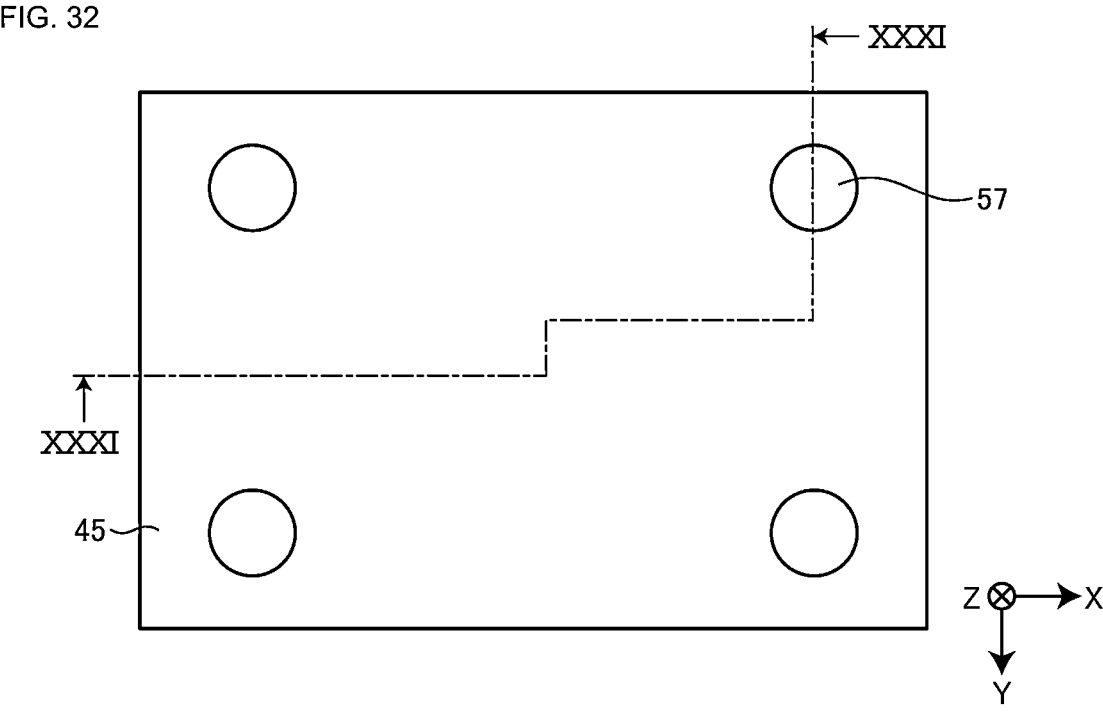
FIG. 32 is a plan view of a first principal surface side of a second substrate of the acoustic wave device according to the fourth preferred embodiment of the present invention.
Figure 33:
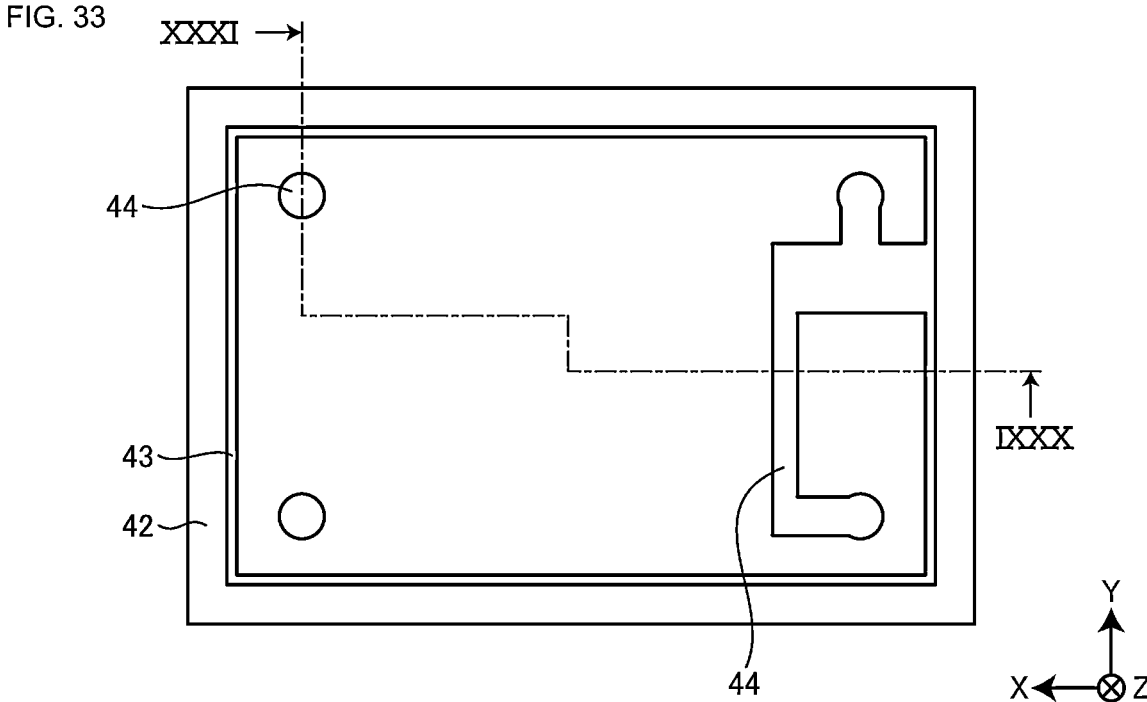
FIG. 33 is a plan view of a second principal surface side of the second substrate of the acoustic wave device according to the fourth preferred embodiment of the present invention.

FIG. 30 is a plan view of a first principal surface side of a first substrate of an acoustic wave device according to a fourth preferred embodiment of the present invention. FIG. 31 is a cross-sectional view of the acoustic wave device according to the fourth preferred embodiment. FIG. 32 is a plan view of a first principal surface side of a second substrate of the acoustic wave device according to the fourth preferred embodiment. FIG. 33 is a plan view of a second principal surface side of the second substrate of the acoustic wave device according to the fourth preferred embodiment.

As shown in FIGS. 30 to 33, in the acoustic wave device according to the fourth preferred embodiment, an acoustic wave element board 10 is covered with a first cover member 40. The functional electrode 30 shown in FIG. 30 is an interdigital transducer electrode including the opposed first busbar electrode and second busbar electrode 6, the electrode fingers 3 connected to the first busbar electrode 5, and the electrode fingers 4 connected to the second busbar electrode 6, shown in FIG. 1B.

As shown in FIGS. 31, 32 and 33, the first cover member includes a lid substrate 41, an electrically insulating layer covering a first principal surface of the lid substrate 41, an electrically insulating layer 42 covering a second principal surface of the lid substrate 41, and a seal metal layer 43 and seal metal layers 44 provided on the electrically insulating layer 42. The lid substrate 41 is, for example, a silicon substrate. The electrically insulating layer 42 and the electrically insulating layer 45 are, for example, silicon oxide.

A terminal electrode 57 is provided in a through-via with a seed layer 56 interposed therebetween. The through-via extends from the first principal surface of the lid substrate 41 to the second principal surface of the lid substrate 41. The seed layer 56 is a multilayer body in which, for example, a Cu layer is laminated on a Ti layer. The terminal electrode 57 is a multilayer body in which, for example, an Au layer is plated on a Cu layer and an Ni layer. The terminal electrode 57 is also referred to as an under bump metal. For example, a ball grid array (BGA) (not shown) bump is laminated on the terminal electrode 57.

The seal metal layer 43 and the seal metal layers 44 each are a metal laminate of gold or a gold alloy and another metal, for example, titanium, and defines and functions as a first support portion that supports the acoustic wave element board 10 on the first cover member 40. The seal metal layer 43 is provided in a linear pattern so as to surround the functional electrode 30 as shown in FIG. 33 in a plan view in the Z direction. The seal metal layer 43 can hermetically seal the second cavity portion 92 shown in FIG. 31.

In a range surrounded by the seal metal layer 43, the seal metal layers 44 are provided. The seal metal layers 44 are made of the same material as the seal metal layer 43 and join the first cover member 40 with the acoustic wave element board 10. Thus, warpage of the acoustic wave element board 10 is reduced or prevented.

The acoustic wave element board 10 includes at least one functional electrode 30 and includes two functional electrodes 30 in the fourth preferred embodiment. The acoustic wave element board 10 includes the support substrate 8 and the piezoelectric layer 2 laminated to the first principal surface 8A of the support substrate 8. The piezoelectric layer 2 includes, for example, lithium niobate or lithium tantalate. The piezoelectric layer 2 may include lithium niobate or lithium tantalate, and inevitable impurities. In the fourth preferred embodiment, the piezoelectric layer 2 is laminated to the support substrate 8 with the intermediate layer 7 interposed therebetween. The intermediate layer 7 does not need to be provided. In the fourth preferred embodiment, the support substrate 8 and the intermediate layer 7 may be integrally referred to as support member. The functional electrode 30 is the same as or similar to the configuration shown in FIG. 1B, so the detailed description is omitted.

The functional electrode 30 is electrically connected to the wires 12, and the wires 12 are thicker than the electrode fingers 3 and the electrode fingers 4.

The first cavity portion 91 shown in FIG. 31 includes a space in the first support member by recessing the intermediate layer 7 at a position that at least partially overlaps the functional electrode 30 when viewed in the Z direction. In this way, the first cavity portion 91 corresponds to the cavity portion 9 shown in FIG. 2 and is connected to the extended passages 9A (see FIG. 30). The first cavity portion 91 and the extended passages 9A define a space formed by etching the sacrificial layer. As shown in FIG. 30, when viewed in a plan view in the Z direction, the outer edge of each through-hole 2H is provided inside the outer edge of a corresponding one of the extended passages 9A. Thus, in a stress distribution applied to the piezoelectric layer 2, a stress concentration is less likely to occur. As a result, a crack starting from the through-hole 2H in the piezoelectric layer 2 is reduced or prevented.

The second cavity portion 92 shown in FIG. 31 defines a space between the acoustic wave element board 10 and the first cover member 40 and is surrounded by the seal metal layer 43.

As described above, the acoustic wave device according to the fourth preferred embodiment includes the acoustic wave element board 10, and the first cover member 40 joined with the acoustic wave element board 10. The acoustic wave element board 10 includes the support substrate 8, the intermediate layer 7 laminated in the first direction to the support substrate 8, the first cavity portion 91 provided in the intermediate layer 7, the piezoelectric layer 2 laminated on the intermediate layer 7 and having the first principal surface and the second principal surface, and the functional electrode 30 provided on the first principal surface of the piezoelectric layer 2. The first cover member 40 includes the lid substrate 41 opposed to the first principal surface of the piezoelectric layer 2, and a support portion that supports the lid substrate 41 between the first principal surface of the piezoelectric layer 2 and the lid substrate 41. In a plan view in the lamination direction of the support substrate 8 and the piezoelectric layer 2, at least a portion of the functional electrode 30 overlaps the first cavity portion 91, and the second cavity portion 92 is provided between the functional electrode 30 and the lid substrate 41. The support substrate 8 is not exposed to the first cavity portion 91.

The first cavity portion 91 is provided only in the intermediate layer 7 and is not provided in the support substrate 8. Thus, the support substrate 8 is more easily ground, so an overall low-profile acoustic wave device is more easily provided. Since the intermediate layer 7 is always sandwiched between the piezoelectric layer 2 and the support substrate 8, characteristic degradation due to a parasitic capacitance is more easily reduced or prevented.

The thickness of the intermediate layer 7 is greater than the thickness of the piezoelectric layer 2. Thus, the first cavity portion 91 is more easily provided only in the intermediate layer 7, so a further low profile is easily achieved.

The thickness of the support substrate 8 may be less than the thickness of the intermediate layer 7. With such a preferred embodiment, a further low profile is more easily achieved.

Furthermore, the through-holes 2H that extend through the piezoelectric layer 2 and reach the first cavity portion 91 are provided. Thus, since the first cavity portion 91 can be formed by using etching, a low profile can be more easily achieved.

An outside end portion of the piezoelectric layer 2 is provided inside an outside end portion of the support substrate 8. Thus, a crack is less likely to occur in the piezoelectric layer 2. An angle between a side wall at the end portion of the piezoelectric layer 2 and the intermediate layer 7 is preferably, for example, smaller than 90°. For example, the side wall at the outside end portion of the piezoelectric layer 2 is a tapered portion. Thus, characteristic degradation is more easily reduced or prevented by scattering unnecessary waves at the end portion of the piezoelectric layer 2.

Figure 34:
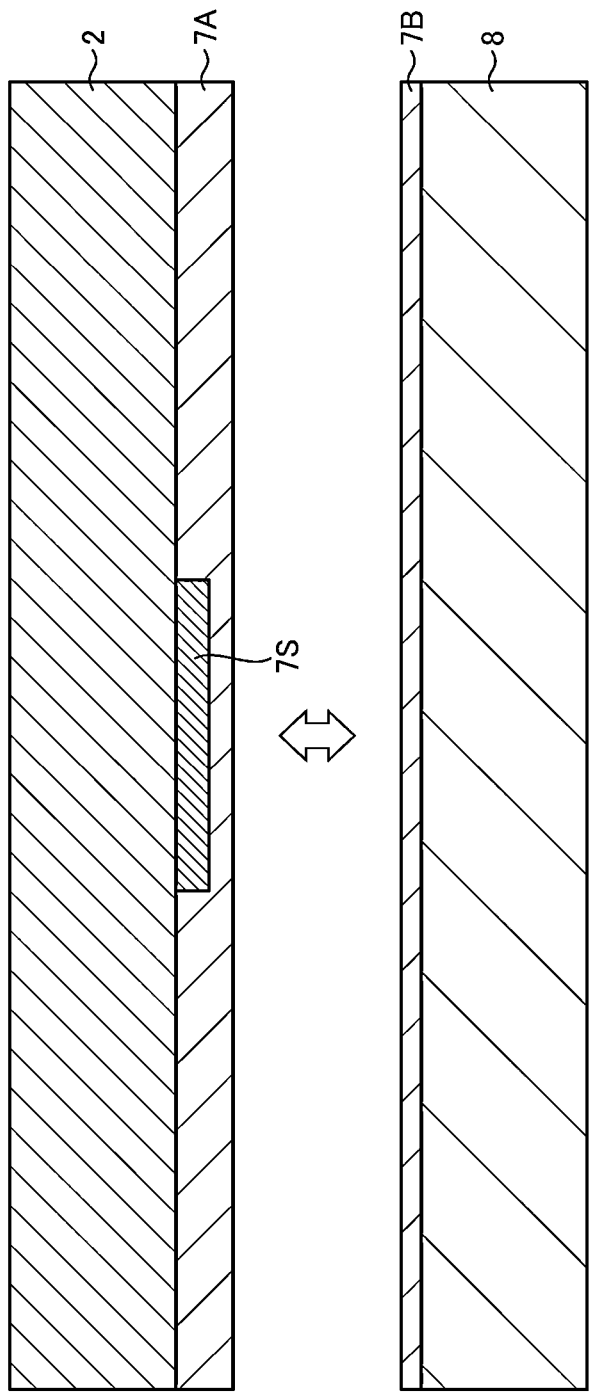
FIG. 34 is a schematic cross-sectional view for illustrating a bonding step of forming a support member of an acoustic wave element board.

FIG. 34 is a schematic cross-sectional view for illustrating a bonding step of forming a support member of an acoustic wave element board. A sacrificial layer 7S is deposited on the second principal surface of the piezoelectric layer 2. Subsequently, a first portion 7A that will be the intermediate layer 7 is deposited so as to cover the second principal surface of the piezoelectric layer 2 and the sacrificial layer 7S. The surface of the first part 7A is flattened such that unevenness due to the influence of the sacrificial layer 7S is eliminated. Subsequently, a second portion 7B that will be the intermediate layer 7 is deposited on the first principal surface of the support substrate 8. Then, the first portion 7A and the second portion 7B are joined with each other, so the piezoelectric layer 2 (piezoelectric substrate) is supported on the support substrate 8.

Figure 35:
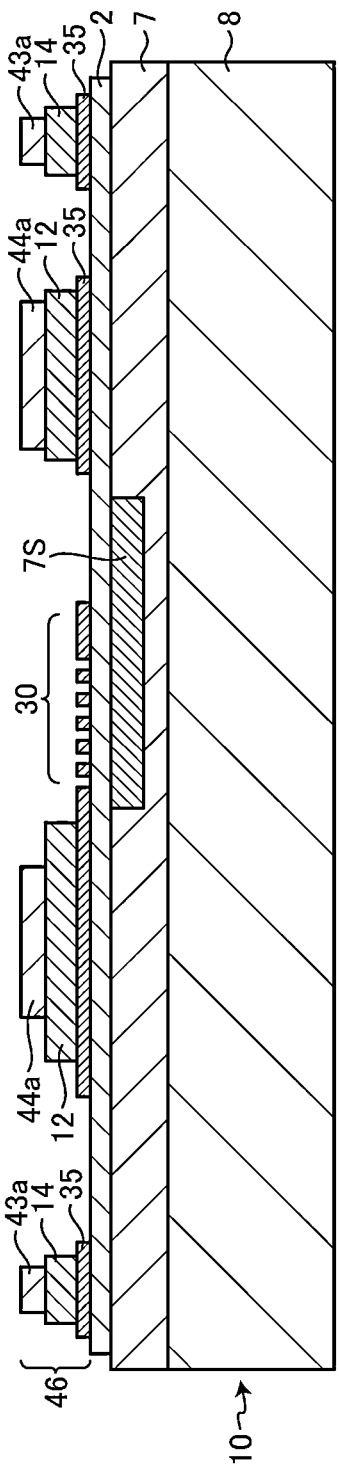
FIG. 35 is a schematic cross-sectional view for illustrating an electrode formation step of forming a functional electrode of the acoustic wave element board.

FIG. 35 is a schematic cross-sectional view for illustrating an electrode formation step of forming a functional electrode of the acoustic wave element board. As shown in FIG. 35, the functional electrode 30 and a portion of the wires are patterned by using the first metal layer 35 on the first principal surface of the piezoelectric layer 2. The second metal layer 14 is formed on the first metal layer 35, and a portion of the second metal layer 14 becomes the wires 12 electrically continuous with the functional electrode 30. A seal metal layer 43*a*, 44*a*is laminated on a portion of each of the second metal layer 14 and the wires 12. The seal metal layer 44*a* is Au or Au alloy.

Figure 36:
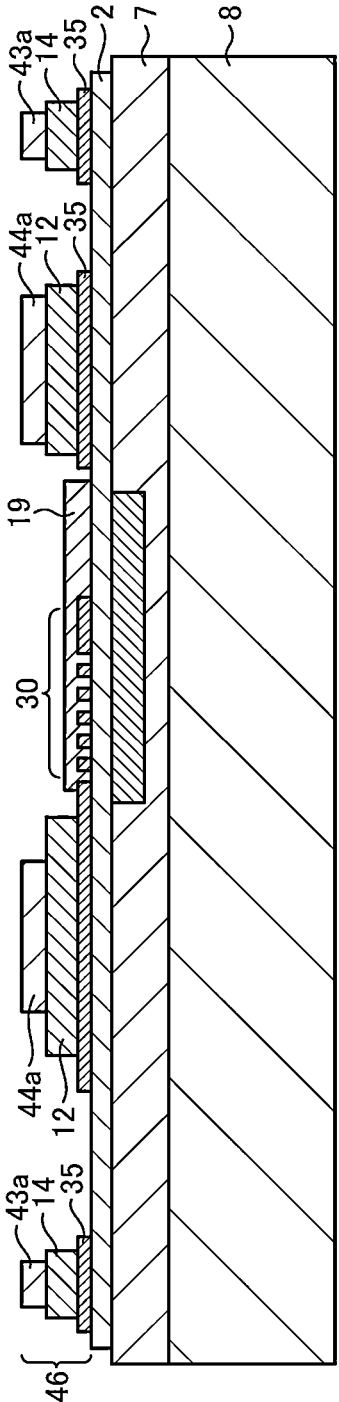
FIG. 36 is a schematic cross-sectional view for illustrating a protective film formation step of forming a protective film covering the functional electrode of the acoustic wave element board.

FIG. 36 is a schematic cross-sectional view for illustrating a protective film formation step of forming a protective film covering the functional electrode of the acoustic wave element board. An area around the functional electrode 30 is masked with a resist, and a dielectric film 19 is formed. Thus, the functional electrode 30 is covered with the dielectric film 19.

Figure 37:
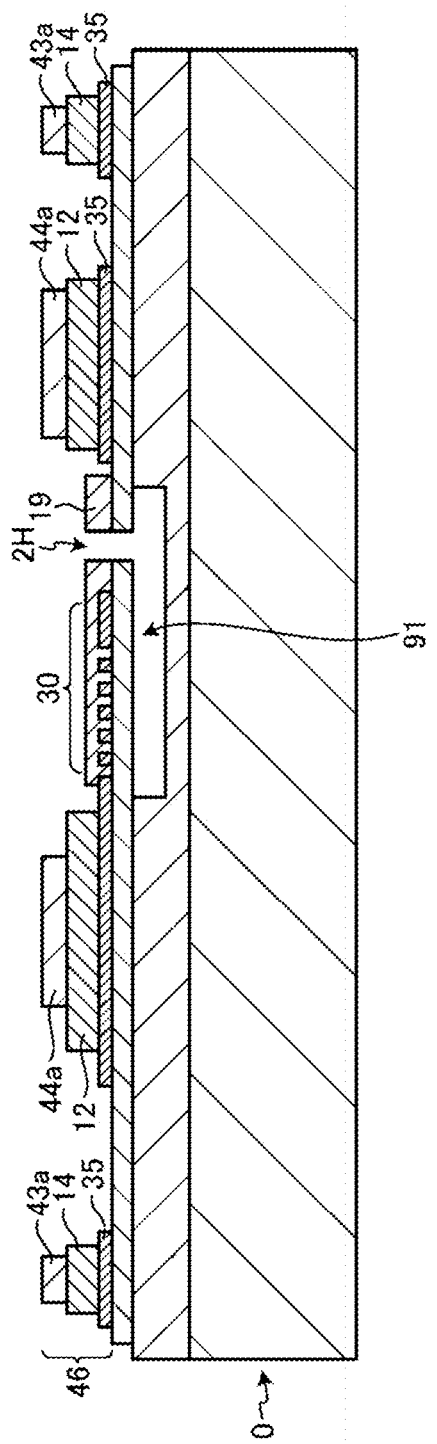
FIG. 37 is a schematic cross-sectional view for illustrating a first cavity portion formation step of forming a first cavity portion of the acoustic wave element board.

FIG. 37 is a schematic cross-sectional view for illustrating a first cavity portion formation step of forming a first cavity portion of the acoustic wave element board. As shown in FIG. 37, initially, the through-hole 2H is formed in the piezoelectric layer 2. The through-hole 2H is perforated in the piezoelectric layer 2 at a position that overlaps the sacrificial layer 7S. Subsequently, an etchant is injected through the through-hole 2H to dissolve the sacrificial layer 7S. Thus, a space where the sacrificial layer 7S has been present becomes the first cavity portion 91. After that, a measuring apparatus is connected to the wires 12, frequency characteristics are checked, and then the film thickness of the dielectric film 19 is adjusted by ion etching or the like. The film thickness of the dielectric film 19 is adjusted until desired frequency characteristics are obtained. Ion etching is repeated until desired frequency characteristics are obtained.

Figure 38:
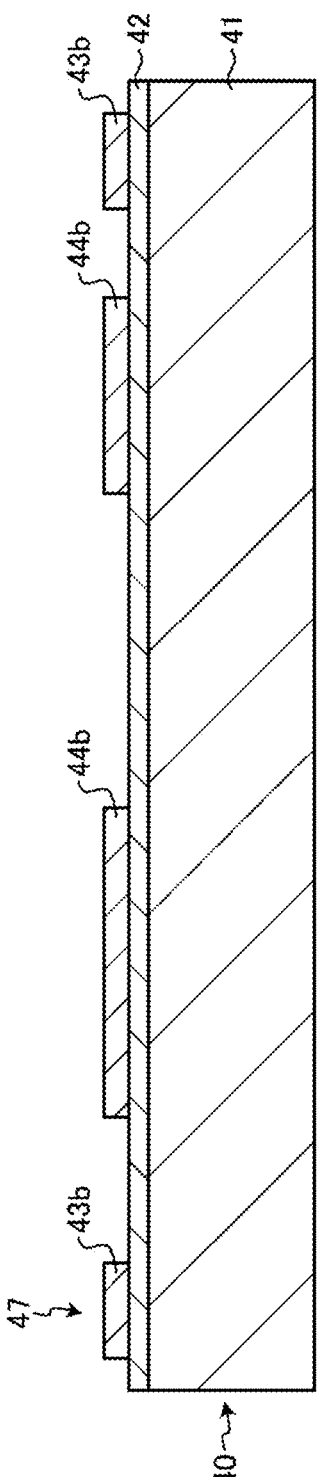
FIG. 38 is a schematic cross-sectional view for illustrating a lid substrate formation step of forming a first cover member.

FIG. 38 is a schematic cross-sectional view for illustrating a lid substrate formation step of forming a first cover member. As shown in FIG. 38, in the lid substrate formation step, the electrically insulating layer 42 is formed on the second principal surface of the lid substrate 41. A seal metal layer 43*b* and seal metal layers 44*b* are formed on the electrically insulating layer 42. The seal metal layer 43*b* and the seal metal layers 44*b* are layers made of Au or Au alloy.

Figure 39:
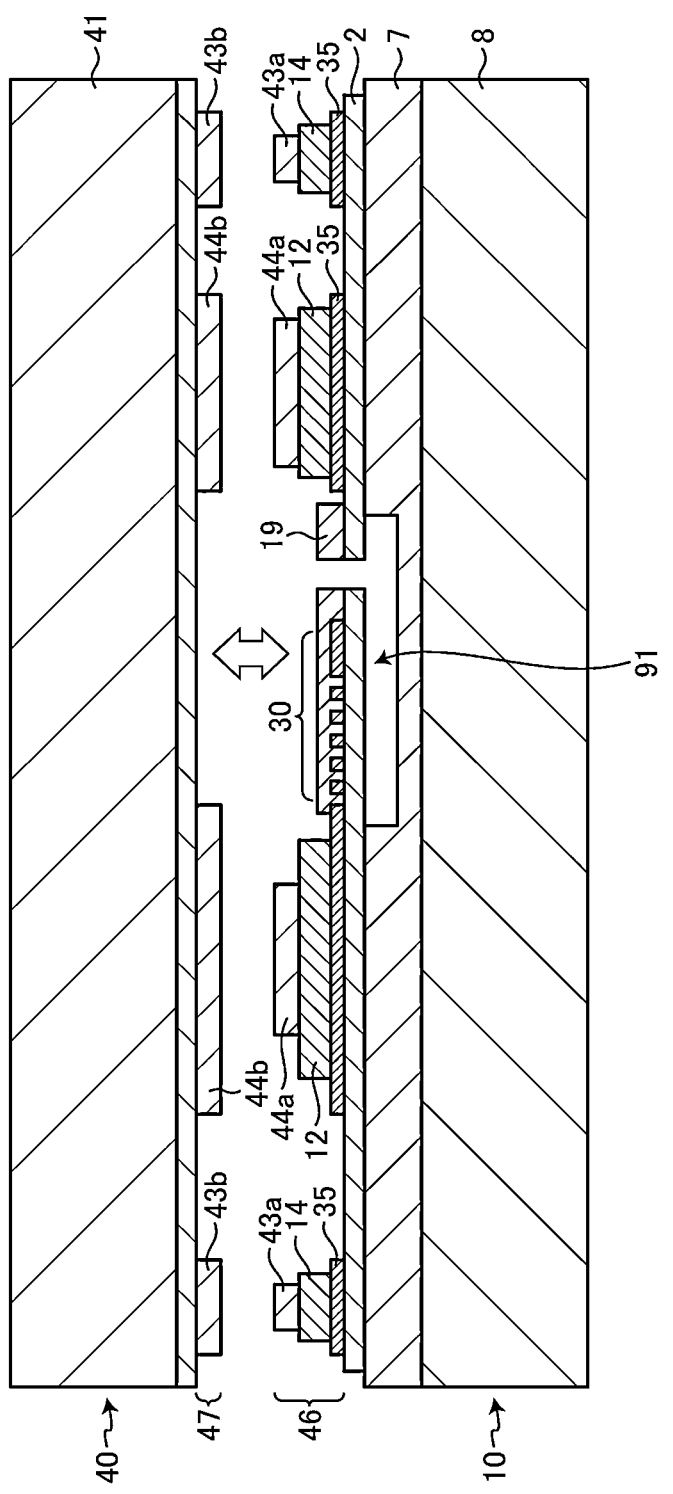
FIG. 39 is a schematic cross-sectional view for illustrating a second cavity portion formation step of forming a second cavity portion by joining the acoustic wave element board with the first cover member.

FIG. 39 is a schematic cross-sectional view for illustrating a second cavity portion formation step of forming a second cavity portion by joining the acoustic wave element board with the first cover member. As shown in FIG. 39, the first cover member 40 is opposed to the acoustic wave element board 10 and joined with the acoustic wave element board 10. Specifically, the seal metal layer 43a of the acoustic wave element board 10 and the seal metal layer 43b of the first cover member 40 are joined by Au-Au joint, and the seal metal layer 43a and the seal metal layer 43b are integrated into the seal metal layer 43. The seal metal layers 44a of the acoustic wave element board 10 and the seal metal layers 44b of the first cover member 40 are joined by Au-Au joint, and the seal metal layers 44a and the seal metal layers 44b are integrated into the seal metal layers 44.

Figure 40:
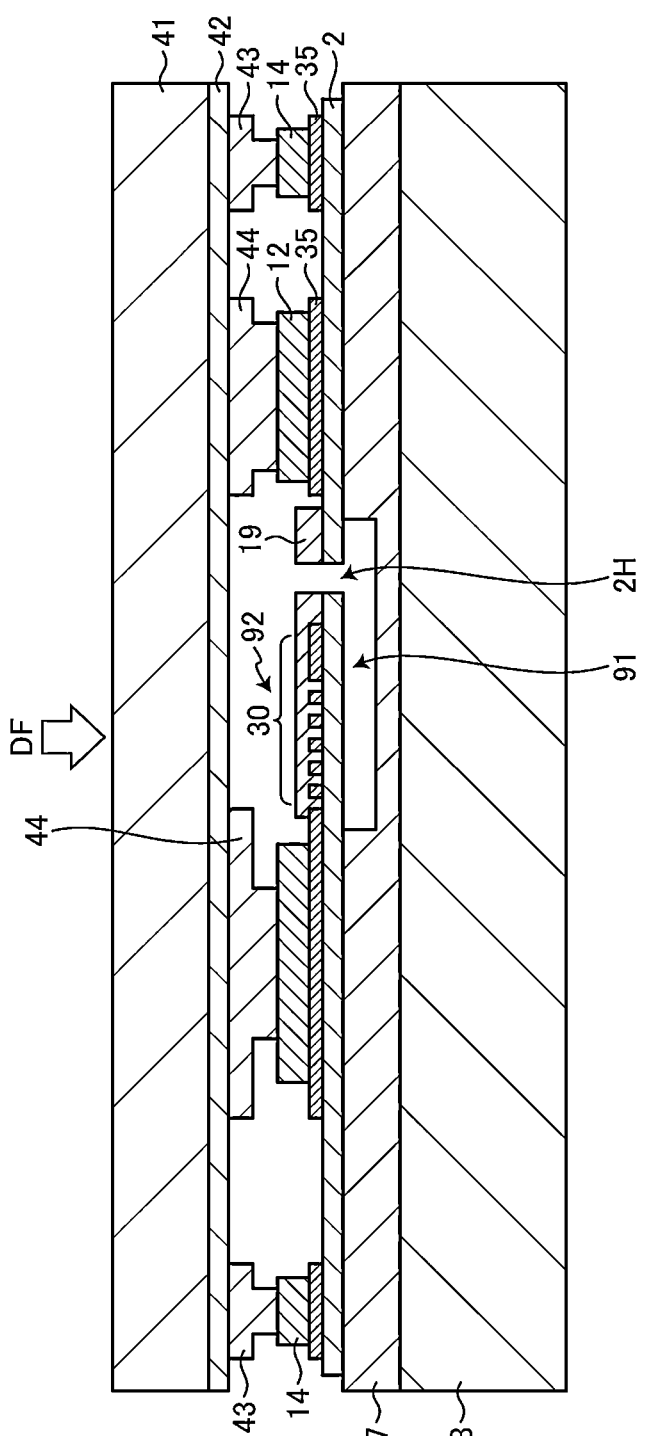
FIG. 40 is a schematic cross-sectional view for illustrating a thinning step of thinning a second substrate.

FIG. 40 is a schematic cross-sectional view for illustrating a thinning step of thinning the second substrate. As shown in FIG. 40, in the thinning step, the first principal surface of the lid substrate 41 is ground with, for example, a grinding tool DF to thin the thickness of the lid substrate 41.

Figure 41:
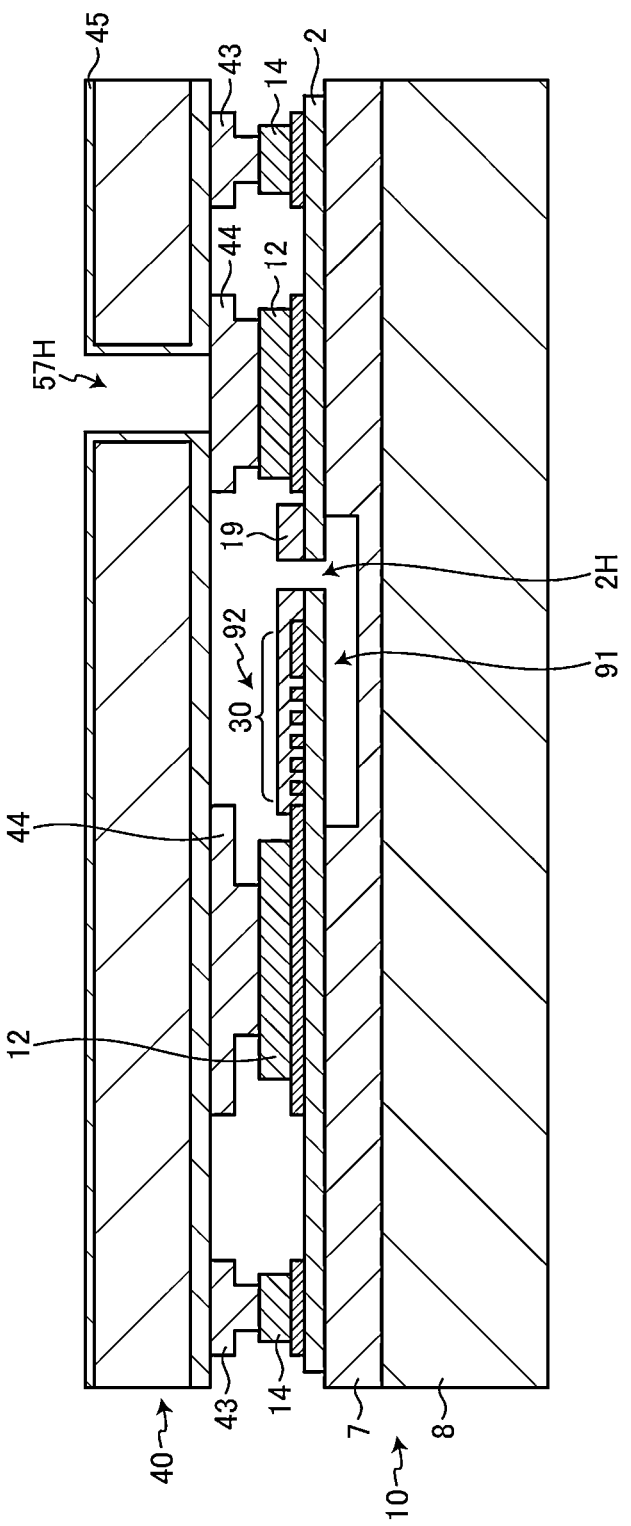
FIG. 41 is a schematic cross-sectional view for illustrating a through-via formation step of forming a through-via in the second substrate.

FIG. 41 is a schematic cross-sectional view for illustrating a through-via formation step of forming a through-via in the second substrate. As shown in FIG. 41, a through-via 57H is formed by, for example, dry etching or reactive ion etching.

Figure 42:
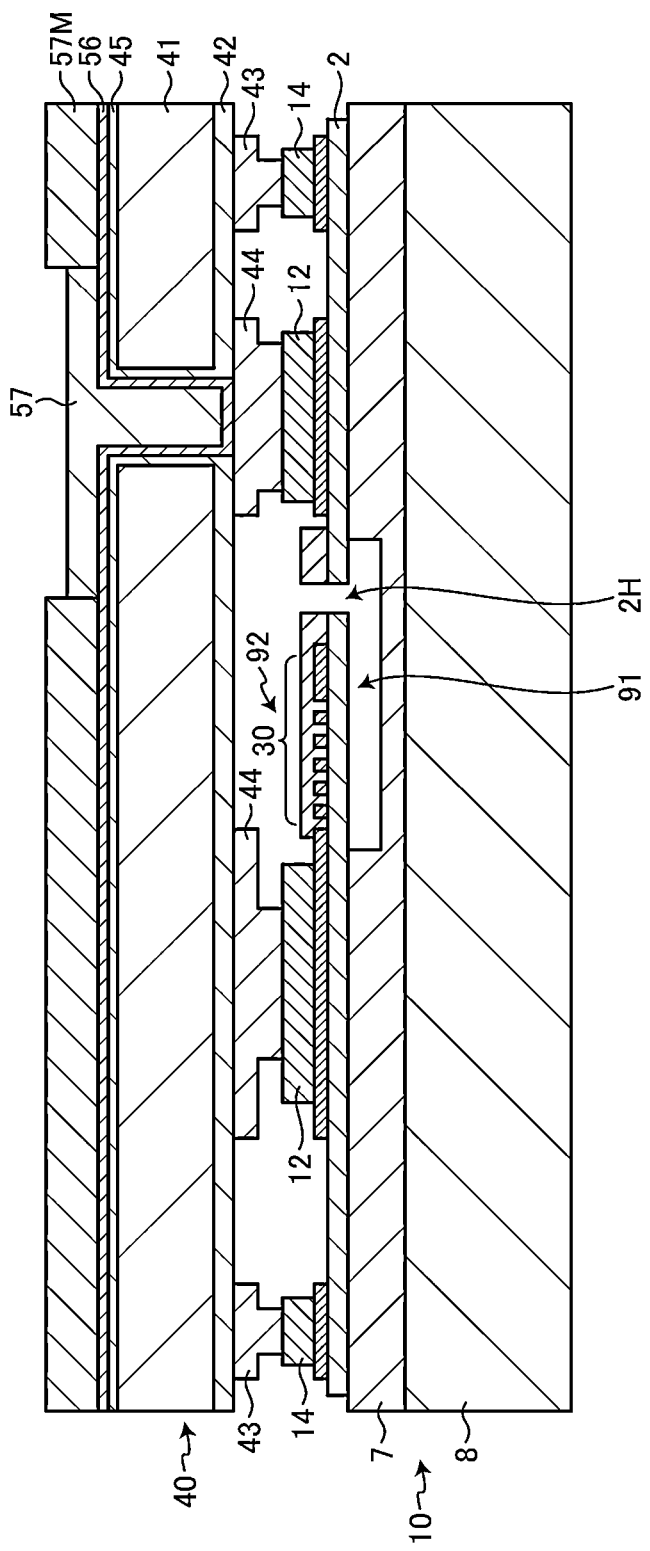
FIG. 42 is a schematic cross-sectional view for illustrating a terminal electrode formation step of forming a terminal electrode on the second substrate.

FIG. 42 is a schematic cross-sectional view for illustrating a terminal electrode formation step of forming a terminal electrode on the second substrate. As shown in FIG. 42, the seed layer 56 is formed so as to cover the through-via 51H shown in FIG. 41. The seed layer 56 is formed by, for example, forming a Ti layer and then laminating a Cu layer on the Ti layer.

As shown in FIG. 42, a plating resist 57M is patterned around a range where a terminal electrode is intended to be formed, then, for example, a Cu layer, an Ni layer, and an Au layer are laminated sequentially on the seed layer 56 by plating, and the terminal electrode 57 is formed.

Figure 43:
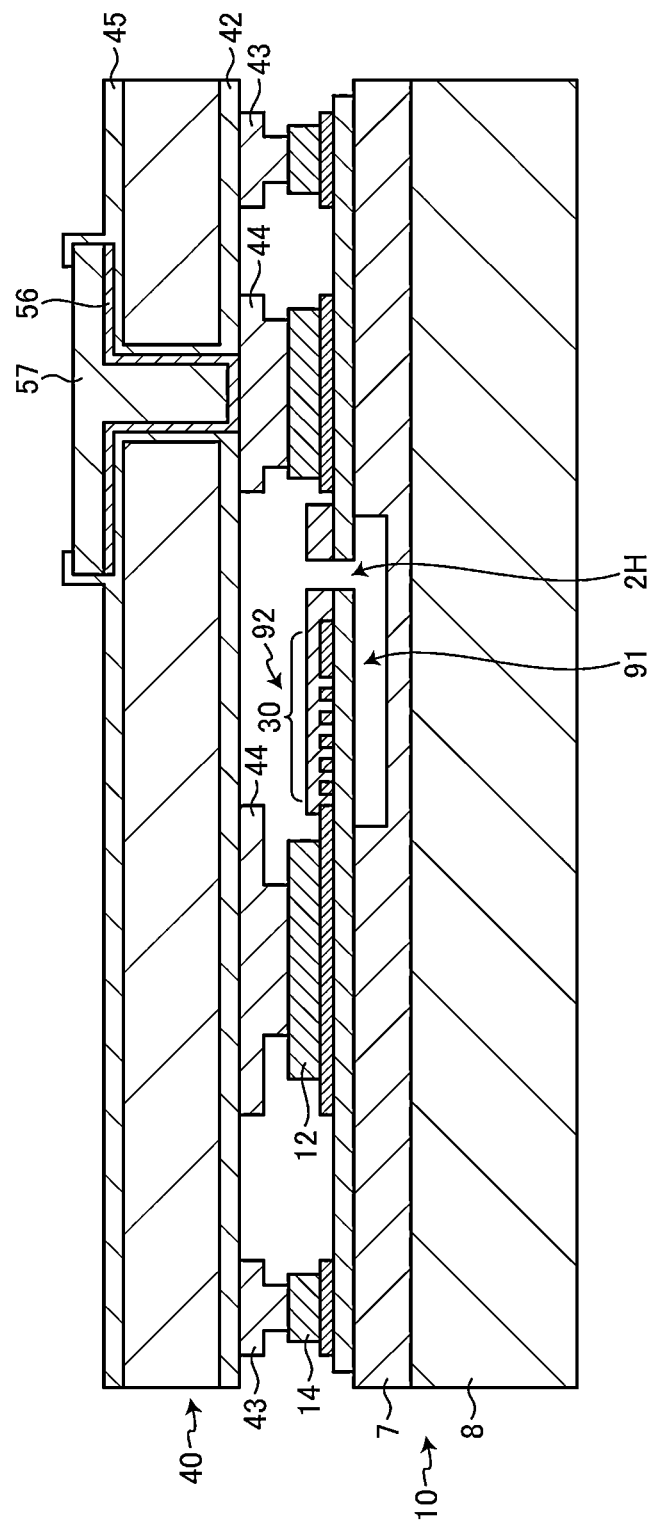
FIG. 43 is a schematic cross-sectional view for illustrating an electrically insulating film formation step of electrically insulating an area around the terminal electrode.

FIG. 43 is a schematic cross-sectional view for illustrating an electrically insulating film formation step of electrically insulating an area around the terminal electrode. As shown in FIG. 43, the plating resist 57M is peeled off, and the seed layer 56 around the terminal electrode 57 is removed. Subsequently, the electrically insulating layer 45 that electrically insulates an area around the terminal electrode 57 is additionally deposited. Where necessary, the thickness of the support substrate 8 may be adjusted by grinding the support substrate 8 with a grinding tool. For example, the thickness of the support substrate 8 can be thinned as compared to the thickness of the intermediate layer 7. Then, acoustic wave devices are cut with, for example, a dicing machine into one by one. The side wall of the outside end portion of the piezoelectric layer 2 may be worked into a tapered portion.

As described above, a manufacturing method for the acoustic wave device according to the fourth preferred embodiment includes the bonding step, the electrode formation step, the first cavity portion formation step, the cover member formation step, and the second cavity portion formation step.

In the bonding step, the support substrate 8 and the piezoelectric layer 2 including the first principal surface and the second principal surface are prepared, the intermediate layer 7 in which the sacrificial layer 7S is embedded is laminated on the second principal surface of the piezoelectric layer 2, and the piezoelectric layer 2 and the support substrate 8 are bonded to each other with the intermediate layer 7 interposed therebetween.

In the electrode formation step, after the bonding step, at least the functional electrode 30 and a first portion 46 of the support portion.

In the first cavity portion formation step, after the electrode formation step, the through-hole 2H is formed in the piezoelectric layer 2 at a position that overlaps the sacrificial layer 7S in a plan view in the lamination direction of the support substrate 8 and the piezoelectric layer 2, an etchant is caused to enter the sacrificial layer 7S by way of the through-hole 2H, to remove the sacrificial layer 7S to form the first cavity portion 91.

In the lid substrate formation step, the lid substrate 41 is prepared, and a second portion 47 of the support portion is formed on the lid substrate 41.

In the second cavity portion formation step, after the first cavity portion formation step and the lid substrate formation step, the first portion 46 and second portion 47 of the support portion are joined with each other to form the second cavity portion 92 between the functional electrode 30 and the lid substrate 41.

With the above-described example of a manufacturing method for an acoustic wave device, since the support substrate 8 and the lid substrate 41 are joined with each other even when the support substrate 8 or the lid substrate 41 is thinned, degradation of the mechanical strength of the support substrate 8 or the lid substrate 41 is reduced or prevented. As a result, even when the acoustic wave device has a low profile, the degradation of mechanical strength is reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate with a thickness in a first direction;

a piezoelectric layer above or below the support substrate; and a functional electrode on the piezoelectric layer; wherein a space is provided between the support substrate and the piezoelectric layer and at least partially overlaps the functional electrode in a plan view in the first direction;

at least one through-hole extends through the piezoelectric layer and communicates with the space;

the at least one through-hole is provided inside an outer edge of the space in a plan view in the first direction; and in a plan view in the first direction, the space includes an extended passage having a smaller area than a region overlapping the functional electrode, and the through-hole is provided inside an outer edge of the extended passage.

2. The acoustic wave device according to claim 1, wherein at least a portion of an outer edge of the through-hole is curved in a plan view in the first direction.

3. The acoustic wave device according to claim 1, wherein at least a portion of the outer edge of the space is curved in a plan view in the first direction.

4. An acoustic wave device comprising:

a support substrate with a thickness in a first direction;

a piezoelectric layer above or below the support substrate; and a functional electrode on the piezoelectric layer; wherein a space is provided between the support substrate and the piezoelectric layer and at least partially overlaps the functional electrode in a plan view in the first direction;

at least one through-hole extends through the piezoelectric layer and communicates with the space;

the at least one through-hole is provided inside an outer edge of the space in a plan view in the first direction; and in a plan view in the first direction, at least a portion of an outer edge of the through-hole is provided along the outer edge of the space and is a section in which a distance to the outer edge of the space is constant or substantially constant.

5. The acoustic wave device according to claim 1, wherein a shape of an outer edge of the through-hole is a circular or substantially circular shape in a plan view in the first direction.

6. The acoustic wave device according to claim 1, further comprising:

an intermediate layer on the support substrate; wherein the space is provided in a portion of the intermediate layer.

7. The acoustic wave device according to claim 1, wherein the functional electrode includes at least one first electrode finger extending in a second direction that intersects with the first direction, and at least one second electrode finger extending in the second direction and each opposed to one of the at least one first electrode finger in a third direction orthogonal or substantially orthogonal to the second direction.

8. The acoustic wave device according to claim 7, wherein, where a center-to-center distance between adjacent first electrode finger and second electrode finger of the at least one first electrode finger and the at least one second electrode finger is p, a thickness of the piezoelectric layer is less than or equal to about 2p.

9. The acoustic wave device according to claim 7, wherein the piezoelectric layer includes lithium niobate or lithium tantalate.

10. The acoustic wave device according to claim 7, wherein the acoustic wave device is configured to generate bulk waves in a first thickness-shear mode.

11. The acoustic wave device according to claim 1, wherein the functional electrode includes at least one first electrode finger extending in a second direction that intersects with the first direction, and at least one second electrode finger extending in the second direction and each opposed to one of the at least one first electrode finger in a third direction orthogonal or substantially orthogonal to the second direction; and where a thickness of the piezoelectric layer is d and a center-to-center distance between adjacent first electrode finger and second electrode finger of the at least one first electrode finger and the at least one second electrode finger is p, d/p is less than or equal to about 0.5.

12. The acoustic wave device according to claim 11, wherein d/p is less than or equal to about 0.24.

13. The acoustic wave device according to claim 1, wherein the functional electrode includes at least one first electrode finger extending in a second direction that intersects with the first direction, and at least one second electrode finger extending in the second direction and each opposed to one of the at least one first electrode finger in a third direction orthogonal to the second direction;

a region in which adjacent first and second electrode fingers overlap when viewed in a direction in which the adjacent first and second electrode fingers are opposed to each other is an excitation region; and where a metallization ratio of the at least one first electrode finger and the at least one second electrode finger to the excitation region is MR, MR$\leq$about $1.75(d/p)+0.075$ is satisfied.

14. The acoustic wave device according to claim 1, wherein the acoustic wave device is configured to generate plate waves.

15. The acoustic wave device according to claim 1, wherein the piezoelectric layer includes lithium niobate or lithium tantalate; and Euler angles ($\phi$, $\theta$, $\psi$) of the lithium niobate or the lithium tantalate satisfy expression (1), expression (2), or expression (3):

$$(0°\pm10°, 0° \text{ to } 20°, \text{ any } \psi) \tag{1}$$

$$(0°\pm10°, 20° \text{ to } 80°, 0° \text{ to } 60° (1-(\theta-50)^2/900)^{1/2}) \text{ or}$$
$$(0°\pm10°, 20° \text{ to } 80°, [180°-60° (1-(\theta-50)^2/900)^{1/2}] \text{ to } 180° \tag{2}; \text{ and}$$

$$(0°\pm10°, [180°-30°(1-(\psi-90)^2/8100)^{1/2}] \text{ to } 180°, \text{ any } \psi) \tag{3}.$$

16. A manufacturing method for an acoustic wave device, the manufacturing method comprising:

preparing a support substrate and a piezoelectric layer including a first principal surface and a second principal surface on an opposite side to the first principal surface, laminating an intermediate layer in which a sacrificial layer is embedded, on the second principal surface of the piezoelectric layer, and bonding the piezoelectric layer and the support substrate with the intermediate layer interposed between the piezoelectric layer and the support substrate;

after the preparing, forming at least a functional electrode and a first portion of a support portion;

after the forming at least the functional electrode and the first portion of the support portion, forming a through-hole in the piezoelectric layer at a position that overlaps the sacrificial layer in a lamination direction of the support substrate and the piezoelectric layer in a plan view, causing an etchant to enter the sacrificial layer via the through-hole, and forming a first cavity portion by removing the sacrificial layer;

preparing a lid substrate and forming a second portion of the support portion in the lid substrate; and after the forming the first cavity portion and the preparing the lid, forming a second cavity portion between the functional electrode and the lid substrate by joining the first portion of the support portion with the second portion of the support portion; wherein the support substrate has a thickness in a first direction; and in a plan view in the first direction, the first cavity portion includes an extended passage having a smaller area than a region overlapping the functional electrode, and the through-hole is provided inside an outer edge of the extended passage.

17. The manufacturing method according to claim 16, wherein the piezoelectric layer includes lithium niobate or lithium tantalate.

18. The manufacturing method according to claim 16, wherein the acoustic wave device is configured to generate bulk waves in a first thickness-shear mode.

19. The manufacturing method according to claim 16, wherein the acoustic wave device is configured to generate plate waves.

\* \* \* \* \*